United States Patent
Greenspan et al.

(10) Patent No.: US 9,559,726 B2
(45) Date of Patent: Jan. 31, 2017

(54) USE OF ERROR CORRECTING CODE TO CARRY ADDITIONAL DATA BITS

(71) Applicant: Intel Corporation, Santa Clara, CA (US)

(72) Inventors: Daniel Greenspan, Jerusalem (IL); Asaf Rubinstein, Tel-Aviv (IL); Julius Yuli Mandelblat, Haifa (IL)

(73) Assignee: Intel Corporation, Santa Clara, CA (US)

( * ) Notice: Subject to any disclaimer, the term of this patent is extended or adjusted under 35 U.S.C. 154(b) by 50 days.

(21) Appl. No.: 14/740,100

(22) Filed: Jun. 15, 2015

(65) Prior Publication Data
US 2016/0365876 A1    Dec. 15, 2016

(51) Int. Cl.
H03M 13/00    (2006.01)
H03M 13/29    (2006.01)
G06F 11/10    (2006.01)

(52) U.S. Cl.
CPC ...... *H03M 13/2942* (2013.01); *G06F 11/1076* (2013.01)

(58) Field of Classification Search
CPC .............................. G06F 11/1012; H03M 13/19
See application file for complete search history.

(56) References Cited

U.S. PATENT DOCUMENTS

| | | | | |
|---|---|---|---|---|
| 6,047,396 A | * | 4/2000 | Hillis .................. | G06F 11/1012 714/763 |
| 2012/0110409 A1 | * | 5/2012 | Gherman ............ | G06F 11/1012 714/755 |
| 2014/0245246 A1 | * | 8/2014 | Choe .................... | G06F 17/5054 716/117 |

OTHER PUBLICATIONS

Check, Cyclic Redundancy, "Error Correcting Codes," pp. 1-27 (Nov. 30, 2007).
Altera, "DDR and DDR2 SDRAM ECC Reference Design," version 1.0, pp. 1-20 (Jun. 2006).
"Hamming Code," definition, wikipedia, http://en.wikipedia.org/wiki/Hamming_code, accessed Apr. 1, 2015.

* cited by examiner

*Primary Examiner* — David Ton
(74) *Attorney, Agent, or Firm* — Lowenstein Sandler LLP

(57) ABSTRACT

Integrated circuits, systems and methods are disclosed in which data bits protected by error correction code (ECC) detection and correction may be increased such that a combination of primary and additional bits may also be ECC protected using existing ECC allocation, without affecting ECC capabilities. For example, the additional bits may be encoded into phantom bits that are in turn used in combination with the primary bits, to generate an ECC. This ECC may then be combined with the primary bits to form a code word. The code word may be transmitted (or stored) so that when the data bits are received (or retrieved), assumed values of the phantom bits may be decoded, using the ECC, back into the additional bits without the phantom bits or the additional bits ever having transmitted (or stored).

24 Claims, 16 Drawing Sheets

USE OF ERROR CORRECTING CODE TO CARRY ADDITIONAL DATA BITS

The present disclosure relates to the field of error correction code (ECC) correction and detection, and, in particular, to the addition to data bits protected by the ECC in existing memory structures and systems.

BACKGROUND

Modern integrated circuits, components and devices include data channels such as structures that transmit and/or receive data, and other structures that store and/or retrieve data from memory. Some of these structures are designed to protect the data by using parity bits for error detection or performing error correction code (ECC) detection and correction using ECC bits or another correction scheme. An ECC may be generated for a number of data bits to be protected that is sent or stored with the data bits to allow a retrieval (or receiving) end to detect whether an error has occurred in the data bits, and in some cases, to allow that error to be corrected.

In modern ECC memory structures, for example, use of a Hamming code has made possible single bit error correction (SEC) and double bit error detection (DED), also known as SECDED. The number of data bits to be protected dictates how many ECC bits are needed for SECDED protection, where the ECC bits contribute to the total number of bits used. For example, 6 (six) ECC bits may protect up to 26 bits of data, 7 (seven) ECC bits may protect up to 57 bits of data, and 8 (eight) ECC bits may protect up to 120 bits of data.

There has arisen the desire to add to data bits (e.g., in the number of metadata bits related to cache memory structures in one case), without modifying the design or manufacturing of parts of an integrated circuit chip capable of the storage or communication of those data bits. In these cases, however, adding to the number of bits stored in memory takes away from the number of ECC bits available for error protection, thus negatively impacting the ability to correct and detect errors. What is needed, therefore, is the ability to both increase the number of data bits for transmission or storage while not negatively impacting the ability to correct/detect errors.

DESCRIPTION OF EMBODIMENTS

Integrated circuits, systems and methods are disclosed in which data bits protected by error correction code (ECC) detection and correction may be increased such that a combination of primary bits and one permutation of additional bits may also be ECC protected using existing ECC logic, without affecting ECC capabilities. For example, the additional bits may be encoded into phantom bits that are in turn used to generate a code word, in combination with the primary bits, for which an ECC is generated. This ECC may then be transmitted (or stored) with the primary bits so that when the data bits are received (or retrieved), the phantom bits may be derived, using the ECC, and decoded back into the additional bits without ever having transmitted (or stored) the additional bits or phantom bits. Values of the additional bits may have a one-to-one correspondence to values of the phantom bits. In this way, already designed and/or built data transmission or memory structures may add to the number of data bits that are carried, yet be able to maintain ECC capabilities for the existing data bits.

In one embodiment, an integrated circuit or system on a chip may include a data encoding circuit to prepare data for error correction when being stored in memory. The data encoding circuit may receive the primary bits and the additional bits and derive a plurality of phantom bits from the additional bits. The data encoding circuit may then generate an error correcting code (ECC) from the combination of the primary bits and the phantom bits, and output, for storing in the memory, a first code word including the ECC and the primary bits. A data decoding circuit may perform error correction on the data read from the memory. The data decoding circuit may retrieve, from the memory, the first code word and generate a second code word from the first code word by appending, to the first code word, assumed values for respective phantom bits. The data decoding circuit may then, using the ECC, correct single bit errors and detect double bit errors of the retrieved code word for a first combination of the phantom bits and the primary bits, and detect single bit errors of the retrieved code word for a plurality of other combinations of the phantom bits and the primary bits. The data decoding circuit may employ any of a various number of error correcting code algorithms. The data decoding circuit may also derive from the second code word, as corrected, the plurality of primary bits and the plurality of additional bits. This derivation may come from a decoder that decodes the phantom bits, as corrected, to generate the additional bits.

Figure 1A:
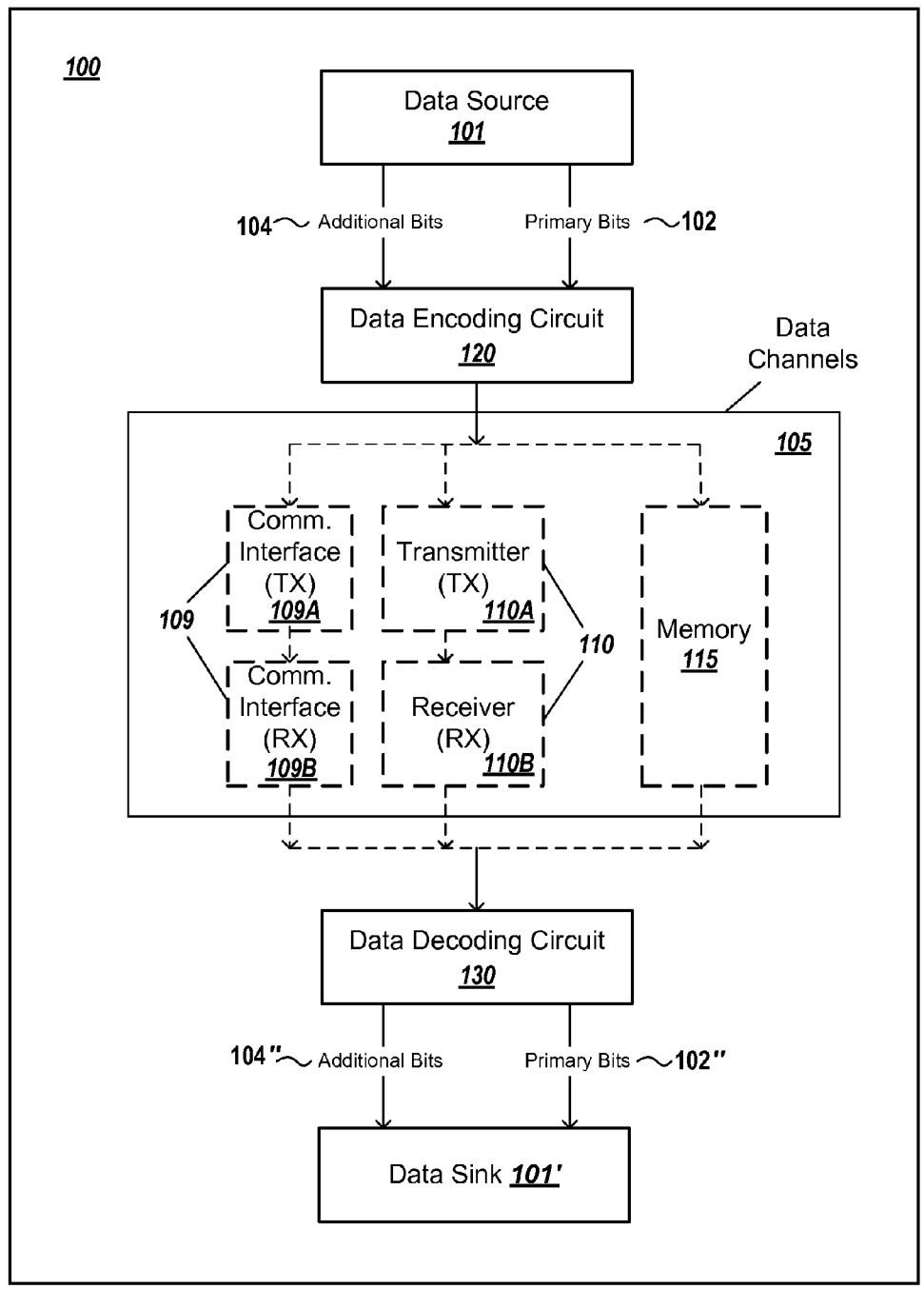
FIG. 1A is a block diagram of an example system architecture that implements error correction and detection according to the present disclosure.

FIG. 1A is a block diagram of an example system architecture 100 that implements error correction and detection according to the present disclosure. The system architecture 100 may include a data source 101 of any kind, such as a component, processor, device, system, or apparatus capable of sending or providing primary bits and the additional bits. The system architecture 100 may also include a data sink 101' of any kind, such as a component, processor, device, system, or apparatus capable of receiving or consuming primary bits and the additional bits.

The system architecture 100 may further include multiple data channels 105 (of which not all need to be present, indicated with the dashed line), a data encoding circuit 120, and a data decoding circuit 130. One or more channels of the multiple data channels 105 may be included in any given component or device in which the present disclosure is implemented.

The data encoding circuit 120 may encode the additional bits into phantom bits that are not stored or transmitted, but may nonetheless contribute to providing to the decoding circuit information sufficient to determine the values of the additional bits. The data encoding circuit 120 may generate an ECC from a combination of the primary bits and the phantom bits. The data encoding circuit 120 may then pass the primary bits and the ECC, as a code word, into one or more of the data channels. A by-product of the passage of the code word through the data channel(s) 105 is that the data channels(s) may introduce unwanted changes (or errors), such that the code word that is later received at the receiver, or retrieved from memory, is not the same that was initially sent or stored.

According to one embodiment, one of the data channels includes a transmission (TX) portion 109A of a communication interface 109 and a receiving (RX) portion 109B of the communication interface 109, the former for sending the code, and the later for receiving the code word, via a wired connection. The TX portion 109A may be located in a first component or device separate from a second component or device in which is located the RX portion 109B, or may be in a single integrated device that contains both the TX portion 109A and the RX portion 109B.

According to another embodiment, one of the data channels includes a transmitter (TX) portion 110A of a transceiver 110 and a receiver (RX) portion 110B of the transceiver 110, the former for sending the code word, and the later for receiving the code word, via a wireless connection. The TX portion 110A may be located in a first component or device separate from a second component or device in which is located the RX portion 110B.

According to yet another embodiment, one of the data channels includes memory 115, in which the code word may be stored, which may be retrieved later by the data decoding circuit 130. The memory 115 may be volatile, non-volatile, may be on-chip memory or cache, random access memory (RAM), static random access memory (SRAM), whether internal or external, and/or storage such as dynamic random access memory (DRAM) or synchronous DRAM (SDRAM) that may be used as main memory. The type of memory is, therefore, unimportant to the present disclosure so long as data stored in the memory 115 is ECC protected or ECC protectable.

The data decoding circuit 130 may decode, from a corrected version of the phantom bits, the additional bits, which may then be appended to the primary bits received from a data transmission or retrieved from memory for an operation or an application that needs both the primary and the additional bits. Depending on the value of the additional bits, and thus the phantom bits, the data decoding circuit 130 may also detect a single error within the primary bits, and in one case, may correct a single error and detect a double error within the primary bits, retaining full SECDED capability as will be explained in more detail. The data decoding circuit may employ any of a various number of error correcting code algorithms.

Figure 1B:
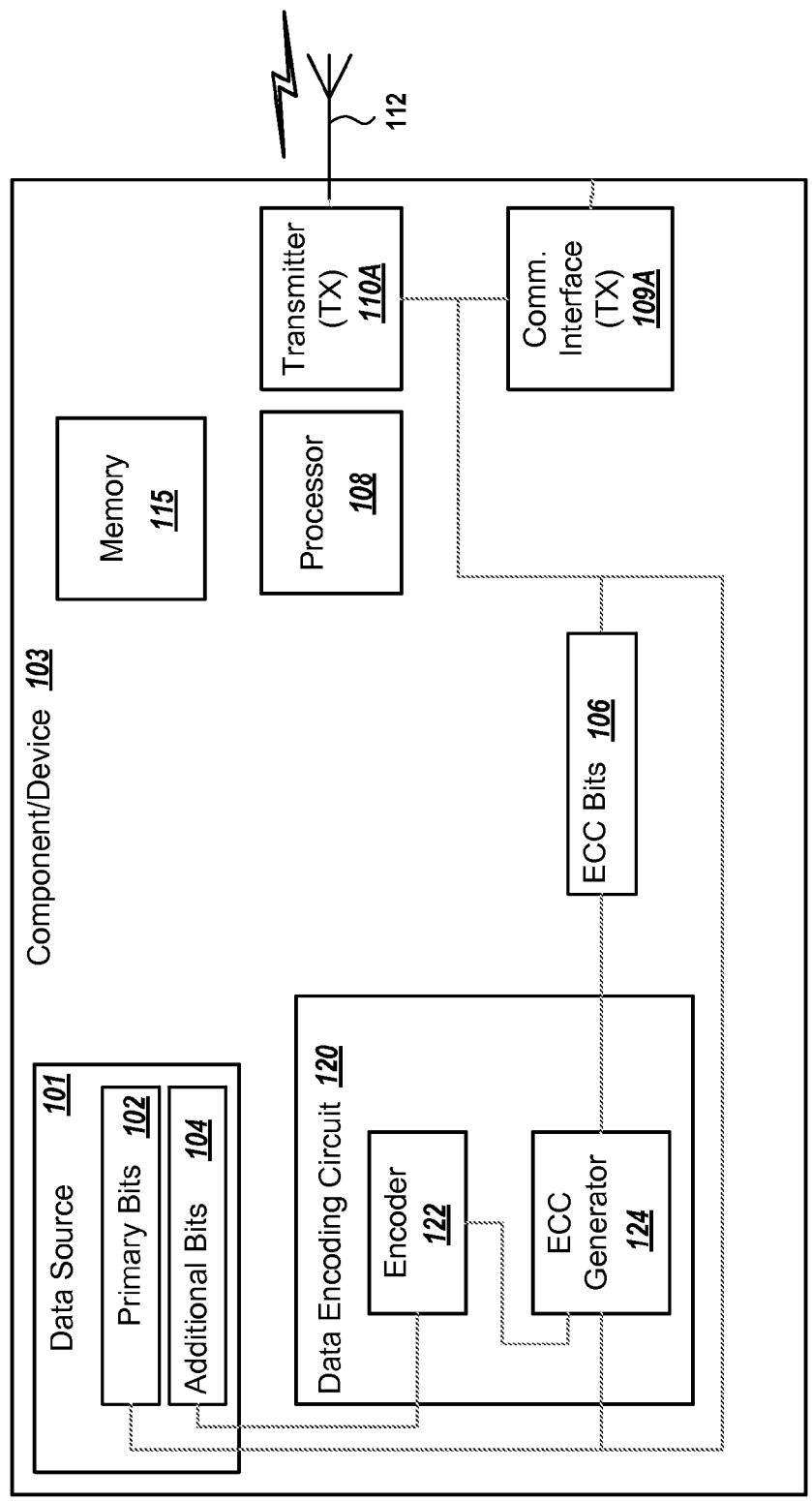
FIG. 1B is a block diagram of the system architecture of a transmitting component or device having a data encoding circuit.

FIG. 1B is a block diagram of a system architecture of a transmitting component or device 103, illustrating more detail related to the data encoding circuit 120. The transmitting component or device 103 may be any component that is part of a larger device, or the device itself, that is capable of transmitting data, whether wirelessly, wired, or a combination of wirelessly and wired communication. Alternatively, or additionally, the component or device is capable of storing data to and/or retrieving data from memory. The transmitting component or device 103 may include a processor 108, the TX portion 109A of a communication interface, a TX portion 110A of a transceiver, an antenna 112, the memory 115 and the data encoding circuit 120.

A data source 101 may provide a plurality of primary bits 102 of data and a plurality of additional bits 104. The data encoding circuit 120 may include an encoder 122 and an ECC generator 124. As will be described in more detail, the encoder 122 may encode the additional bits 104 into a plurality of phantom bits. The ECC generator 124 may then generate an ECC, including a plurality of ECC bits 106, from a combination of the primary bits 102 and the phantom bits. The ECC and the primary bits may be transmitted as a code word to another component or device via the TX portion 109A of the communication interface, or the TX portion 110A of the transceiver, and the antenna 112. This code word may also be stored in the memory 115 for later retrieval by the data decoding circuit 130. In one embodiment, the data encoding circuit 120 may form the code word by joining the ECC and primary bits. In another embodiment, and as illustrated, the primary bits 102 may be combined with the ECC bits 106 to form the code word outside of the data encoding circuit 120.

The ECC generator 124 may apply coding techniques, such as the addition of parity bits according to the Hamming scheme, usable by the data decoding circuit 130 to correct and detect errors in the encoded data bits. In some embodiments, the correction and detection capability may extend to single bit error correction (SEC) and double bit error detection (DED), also known as SECDED. Through use of the phantom bits, as will be described in more detail, the component or device 103 may transmit and/or store the code word in which is encoded the additional bits, yet maintain ECC capabilities for the primary bits.

Figure 1C:
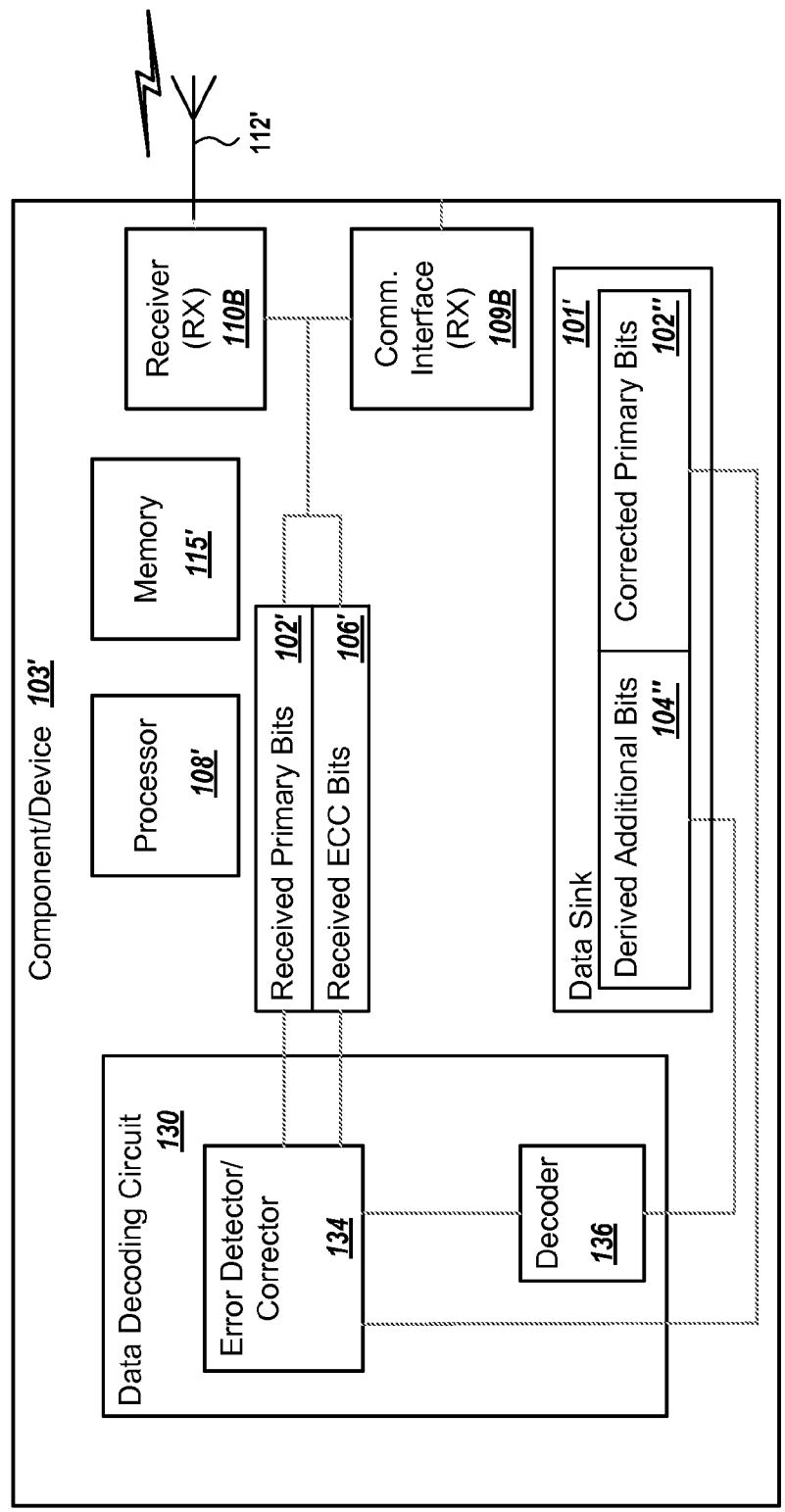
FIG. 1C is a block diagram of the system architecture of a receiving component or device having a data decoding circuit.

FIG. 1C is a block diagram of a system architecture of a receiving component or device 103', illustrating more detail related to the data decoding circuit 130. The receiving component or device 103' may be any component that is part of a larger device, or the device itself, that is capable of receiving data, whether wirelessly, wired, or a combination of wirelessly and wired communication. Alternatively, or additionally, the component or device is capable of storing data to and/or retrieving data from memory. Note that the transmitting component or device 103 may be combined with the receiving component or device 103' in any circuit, chip, component, device or processor, for example, and may communicate with other such circuits, chips, components, devices or processors.

The receiving component or device 103' may include a processor 108', the RX portion 109B of a communication interface, the RX portion 110B of a transceiver, an antenna 112', memory 115', and a data decoding circuit 130. The data decoding circuit 130 may include an error detector and corrector 134, which may be embodied as an integrated circuit, component or logic, and may further include a decoder 136.

The receiving component or device 103' may receive, via the RX portion 109B of a communication interface or the RX portion 110B of a transceiver, and the antenna 112', a plurality of ECC bits 106' and a plurality of primary bits 102' (or code word) transmitted by the transmitting component or device 103 (FIG. 1B). The accent (') here indicates that the ECC bits and the primary bits in FIG. 1C have been received after transmission, and thus may include an error. As described, the received ECC bits 106' and the received primary bits 102' may differ from the transmitted ECC bits 106 and the transmitted primary bits 102 due to errors introduced in the data channel(s) 105. In this way, the error detector and corrector 134 may receive a version the code word having errors when compared to the code word that was transmitted or stored by the data encoding circuit 120 (FIG. 1B). The error detector and corrector 134 may then generate a second code word by including assumed values of phantom bits (such as all zeroes, for example) with the combination of the received ECC bits 106' and the received primary bits 102'. The error detector and corrector 134 may correct any single error and may report detection of any two errors (which are uncorrectable) by processing the second code word, using the ECC bits.

For example, a mistake in the assumed value of the phantom bits may be handled by the error detector and corrector 134 in a similar manner to a system in which the phantom bits had been transmitted over the data channel and incurred an error (such as a single '1' bit turning into a '0') in the process of transmission and reception through the channel. Thus, the single bit error correction may include flipping an incorrect bit found within the assumed values of the phantom bits. The decoder 136 may then decode the corrected phantom bits to derive (and output) a plurality of derived additional bits 104", which may accompany a plurality of corrected primary bits 102" also output by the data decoding circuit 130 after any corrections, to the data sink 101'. The corrected primary bits 102" and the derived additional bits 104" are, therefore, a final output of the primary bits and additional bits, post correction by the data decoding circuit 130. These derived additional bits 104" may then be sent with the corrected primary bits 102" to a requesting operation or application of the receiving component or device 103'.

In some embodiments, as will be explained in additional detail with reference to FIGS. 4 and 5, the stored primary bits 102 and ECC bits 106 may be retrieved from the memory 115' as retrieved primary bits 102' and ECC bits 106' by a retrieving component or device. This may occur, for example, when a storing component or device is combined with a retrieving component or device, and the encoding operation of the data encoding circuit 120 ends with saving the ECC bits 106 and the primary 102 bits in the memory 115 (which is one and the same with the memory 115'). This may also occur when the retrieved primary bits 102' and the ECC bits 106' are stored in the memory 115' of the retrieving device or component upon receipt of the primary and ECC bits from a storing device or component, and then are retrieved at a later time by the requesting operation or application, e.g., during a read request or during a write request.

Figure 2:
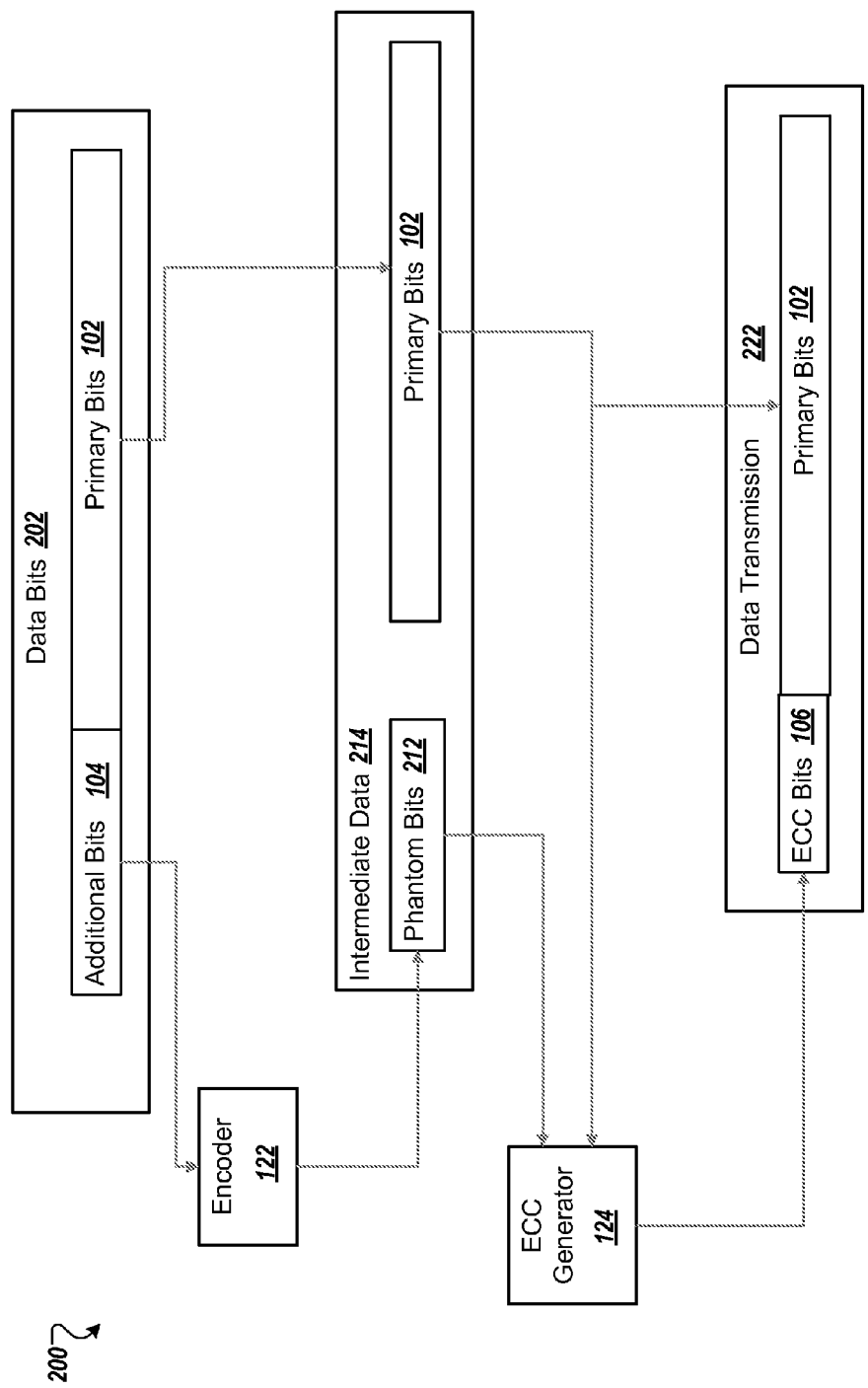
FIG. 2 is a data flow diagram illustrating the functioning of the data encoding circuit of FIG. 1B when transmitting data.

FIG. 2 is a data flow diagram 200 illustrating the functioning of the data encoding circuit 120 of FIG. 1B when transmitting data, according to one embodiment. A plurality of data bits 202 may include the plurality of primary bits 102 and the plurality of additional bits 104. The encoder 122 may then encode the additional bits 104 into a plurality of phantom bits 212. The choice of phantom bits and permutations of phantom bits employed may be such as to allow the phantom bits to be carried within the ECC used for the primary bits. In at least one embodiment, there may be a one-to-one correspondence between valid permutations of the additional bits 104 and valid permutations of the phantom bits 212, e.g., as a one-hot (or no-hot) data bit. For example, where there are four additional bits, there may be fifteen phantom bits (14:0) for encoding the four additional bits as one-hot data bits within the phantom bits, with an example of the encoding as shown in Table 1.

TABLE 1

| Additional Bits | Phantom Bits |
| --- | --- |
| 0000 | 000000000000000 |
| 0001 | 000000000000001 |
| 0010 | 000000000000010 |
| 0011 | 000000000000100 |
| 0100 | 000000000001000 |
| 0101 | 000000000010000 |
| 0110 | 000000000100000 |
| 0111 | 000000001000000 |
| 1000 | 000000010000000 |
| 1001 | 000000100000000 |
| 1010 | 000001000000000 |
| 1011 | 000010000000000 |
| 1100 | 000100000000000 |
| 1101 | 001000000000000 |
| 1110 | 010000000000000 |
| 1111 | 100000000000000 |

Additional phantom bits may be used to encode more than four additional bits, for example, following a similar pattern to the one shown in Table 1.

Intermediate data 214 may include the primary bits 102 and the phantom bits 212. The ECC generator 124 may then process a combination of the primary bits 102 and the phantom bits 212 to generate an ECC, e.g., the plurality of ECC bits 106. The ECC bits 106 and the primary bits 102 may make up a code word that may be transmitted in a data transmission 222 to another component or device containing the data decoding circuit 130. In examples provided herein, systematic error correcting codes are shown, where the primary bits 102 may be embedded in the code word for the data transmission 222. However, the present disclosure may also be applied to non-systematic schemes where the code word for data transmission 222 does not contain the values of the primary bits 102, but perhaps a coded version of the primary bits 102 or the like.

Figure 3:
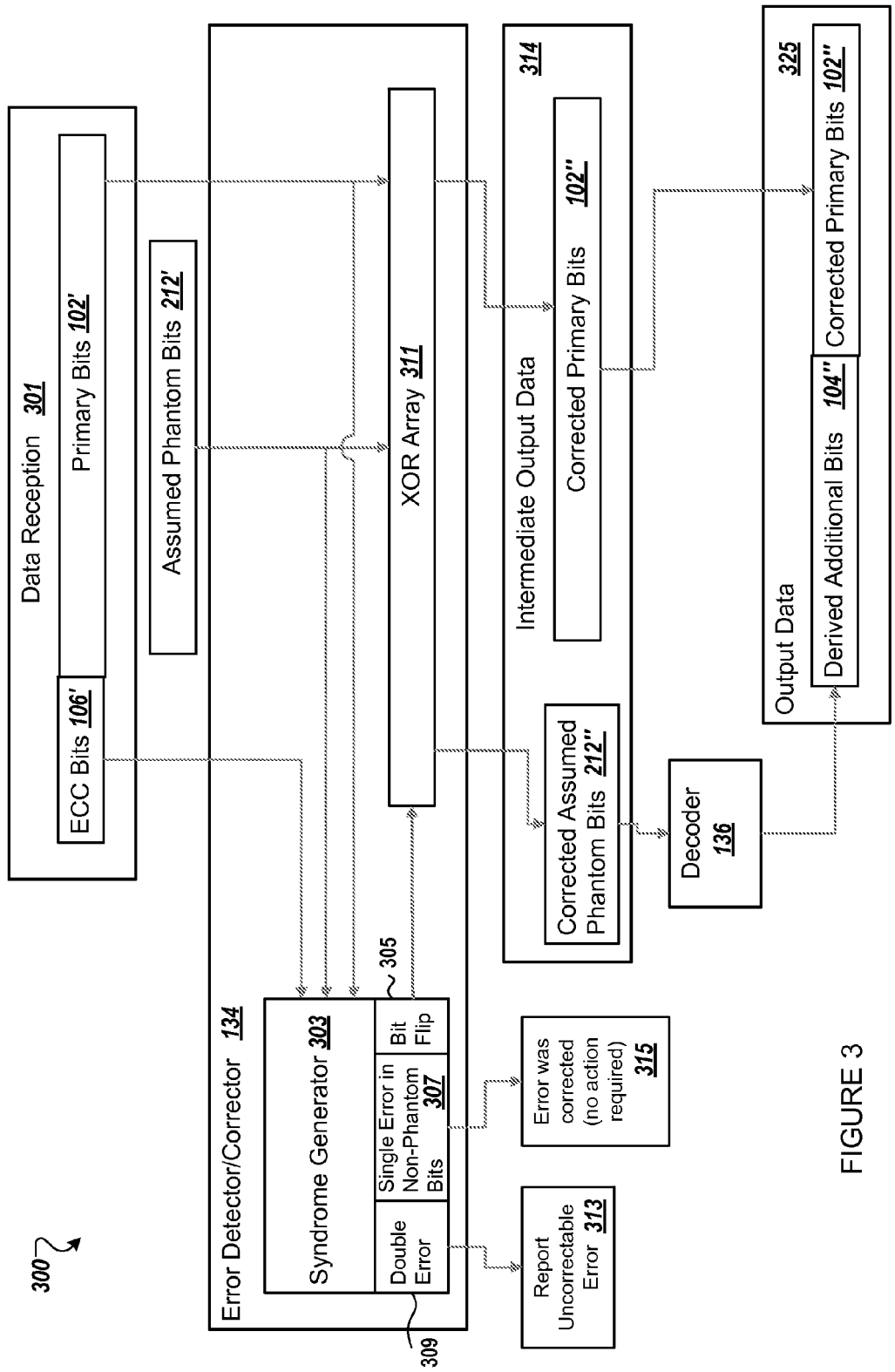
FIG. 3 is a data flow diagram illustrating the functioning of the data decoding circuit of FIG. 1C when receiving data.

FIG. 3 is a data flow diagram 300 illustrating the functioning of the data decoding circuit 130 of FIG. 1C including data reception 301 containing a plurality of received primary bits 102' and a plurality of received ECC bits 106' (this being the received version of the code word). The errors within the received code word, including the received primary bits 102' and the received ECC bits 106', may have been introduced in the data channel 105 (FIG. 1A).

A plurality of assumed phantom bits 212' may be combined with the received primary bits 102' and the received ECC bits 106' to generate a second code word. In one embodiment, the assumed phantom bits 212' are assumed to be all zeros because, based on the encoding (such as shown in Table 1), at most only one of the phantom bits should be a one. The error detector and corrector 134 may process the second code word for errors by applying knowledge of the encoding technique used to create the ECC bits 106 at the data encoding circuit 120.

The error detector and corrector 134 may include, for example, a syndrome generator 303 to perform the error correction and detection and an XOR array 311 to output post-corrected data bits. In one embodiment, the syndrome generator 303 may direct a bit flip 305 of one of the assumed phantom bits 212' based on one of the phantom bits being assumed incorrectly. In other words, for anything but all zeros (0000) in the additional bits 104, the syndrome generator 303 may request, with a bit flip 305, that the XOR array 311 correct a specific assumed zero to be a "one" within the assumed phantom bits 212', resulting in the corrected assumed phantom bits 212". In this way, the values of the received additional bits may be derived by the error correcting process itself, on the basis of correcting an erroneous assumption of the values of the phantom bits, without expanding or modifying bandwidth for transmission of the additional bits 104 across the data channel.

When all of the additional bits 104 (and thus all of the phantom bits 212) are zeros (e.g., 0000), the syndrome generator 303 may retain full SECDED capability for the non-phantom bits and may indicate the detection a single error in the non-phantom bits (307) or the detection a double error in the non-phantom bits (309). When detecting the single error, the syndrome generator 303 may indicate that it instructed the XOR array to correct the error without need for further action (315). When detecting a double error, the syndrome generator 303 may report an uncorrectable error (313), which may be handled with a flag, interrupt or other request needed to ignore the erroneous data and may also be used to request a repeat transmission of the data.

When the additional bits 104 are anything but all zeros (0000) and thus the assumed phantom bits 212' are in need of correction (as is the case for most of the encodings of Table 1), the syndrome generator 303 may still detect a single error in the received primary bits 102' and may report an uncorrectable error (313) so that the component or device may react to that single error (e.g., ignoring the erroneous data and re-requesting that data be re-transmitted).

The assumed phantom bits 212' and the received primary bits 102' may then be passed through the XOR array 311 where the assumed phantom bits 212' are corrected before being output by the error detector and corrector 134. A set of intermediate output data 314 may then contain a plurality of corrected assumed phantom bits 212" and a plurality of corrected primary bits 102", understanding that in some cases these will not need to be corrected. The decoder 136 may then decode, by application of Table 1 in reverse, the corrected assumed phantom bits 212" into a plurality of derived additional bits 104" to be output with the plurality of corrected primary bits 102" as output data 325. The derived additional bits 104" are expected to match the additional bits 104 formerly encoded by the encoder 122.

Figure 4:
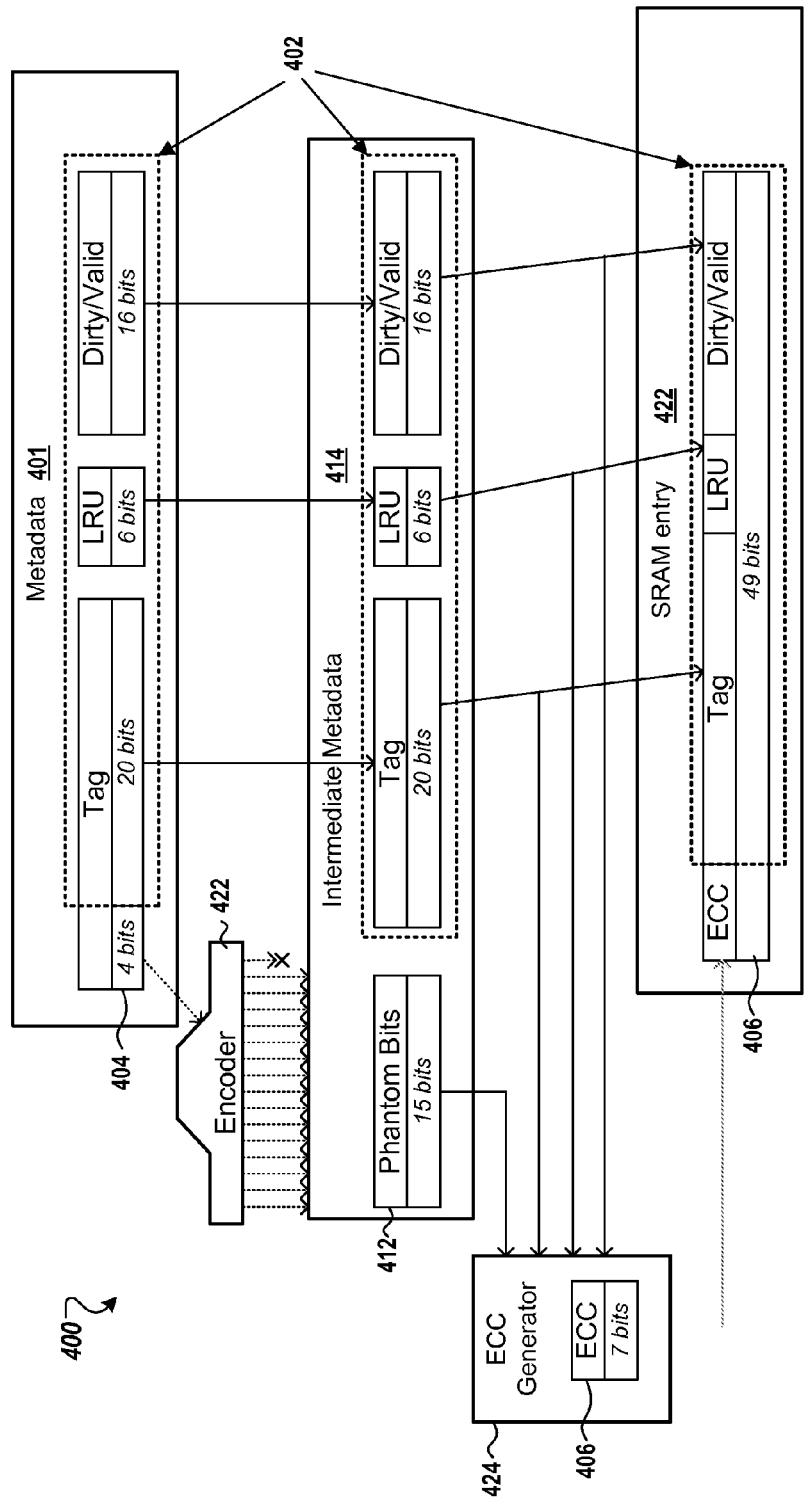
FIG. 4 is a data flow diagram for cache metadata as a memory storage example of the functioning of the data encoding circuit of FIG. 1B.

FIG. 4 is a data flow diagram 400 for cache metadata 401 as a memory storage example of the functioning of the data encoding circuit 120 of FIG. 1B. Modern integrated circuits generally include on-die static random access memory (SRAM) structures. One of the purposes for these SRAM structures is for handling cache metadata 401. The cache metadata 401 may include a plurality of primary bits 402 of data as discussed previously. In this particular example, the primary bits 402 may be further include a plurality of dirty/valid bits (such as 16 bits in this example), a plurality of least recently used bits (LRU) (such as 6 in this example) and a plurality of tag bits (20 bits in this example).

To handle a single event of upset and yield issues, the SRAM structures often implement an error correcting code (ECC) as discussed previously. There may be tens of thousands of SRAM entries, possibly more. Enlarging entries by even a single bit is a costly undertaking in both manufacturing changes and in processing power and efficiency.

In some cases, there is a design reason to store additional metadata bits 404 without increasing the size of the on-die SRAM structure used to hold the cache metadata 401. An example is the case where a system or device is required to support an enlarged system address space (say 40 bits in place of 36 bits), requiring an additional four tag bits to be stored for each entry. The requirement not to increase the size of the SRAM may come from floor plan, cost, power and even scheduling constraints related to manufacturing. These may be overwhelming where the main target market or main use case for a chip does not actually require the enlarged address space support provided by these additional four tag bits. Manufacturers, therefore, may want to transparently avoid impacting the error correction and detection capabilities for the main use case and also avoid taking the cost and power consumption impact of adding additional metadata bits that would not be used for the main use case.

Generally, a single error in on-die SRAM is considered fatal to correct operation of a chip or sub-process of the chip. However, in some situations, such as where the on-die metadata is write-through to an external memory device, a single error, provided that its presence has been identified, may be corrected at the cost of the additional latency of a read of the metadata from the external memory device. Accordingly, single error detection may be sufficient for the majority of needed error detection and correction capabilities.

Taking, as an example, the data flow diagram 400 of FIG. 4, the ECC generator may have been used to generate a 7-bit ECC to protect the 42 primary bits 402 of cache metadata 401 (prior to the addition of the additional four tag bits 404). In this case, by virtue of a 7-bit ECC being able to protect up to 57 data bits, it is possible to add an additional 15 bits representing additional cache metadata. These additional bits may be referred to as phantom bits 412, as they are not actually stored. It is possible to choose an encoding scheme for these phantom bits (e.g., as in Table 1) such that in place of storing and retrieving their values, the values may be assumed to a fair degree of accuracy, with the ECC correction and detection scheme used to correct any small errors in the assumed values. For example, let us say that the phantom bits are encoded using a single one-hot (or no-hot) data bit present in those bits. Let us say further that, in place of retrieval of the phantom bits, we assume that the phantom bits all had value zero. In a worst case scenario, the assumption would be incorrect regarding a single one of those bits.

More specifically, an encoder 422 may be a 4-to-16 one-hot encoder used to convert the four additional bits 404 to 15 phantom bits 412 (with the least-significant of the sixteen bits ignored). Intermediate metadata 414 may then include the primary bits 402 of cache metadata 401 and the 15 phantom bits 412 representing the additional bits 404 of cache metadata 401. The ECC generator 424 may then generate an ECC (e.g., 7 ECC bits 406) from a combination of the primary bits 402 and the 15 phantom bits 412 from the intermediate metadata 414. The ECC 406 may then be stored with the primary bits 402 as a code word in an SRAM entry 422 in memory.

The ECC generator 424 may protect up to 57 total bits with 7 ECC bits, whether that many data bits are actually being processed. The one-hot data bit encoding of Table 1 may be employed in this cache storage implementation to add up to four additional cache metadata bits 404 that may be carried by the ECC code, and where all 15 bits are zero provides a sixteenth permutation of the additional bits as mapped to the phantom bits. The advantage of having this special combination of the additional bits 404 (e.g., all being zero) is that, for this special combination, the phantom bit values are identical to the assumed values for the phantom bits (FIG. 5) and the integrated circuit or chip retains full SECDED behavior for the 42 primary bits 402. Thus, the design may be used and manufacturing-tested as if the chip were full SECDED, merely by choosing to remain with that specific permutation of the additional bits (e.g., all zeroes). Likewise, chips that have permanent single-bit manufacturing defects may be chosen for use only in applications that do not require other combinations of the additional 4-bit number, and thereby retain full SECDED capability.

The other combinations of the additional bits 404 (such as the 4-bit numbers corresponding to values of the phantom bits in which one phantom bit is a one ("1")) results in a single-bit error detection (SED) behavior for the 42 primary bits 102. Where the cache metadata is used in write-through mode, this allows a single error to be identified and corrected at the cost of the latency of a read from the external memory structure.

Figure 5:
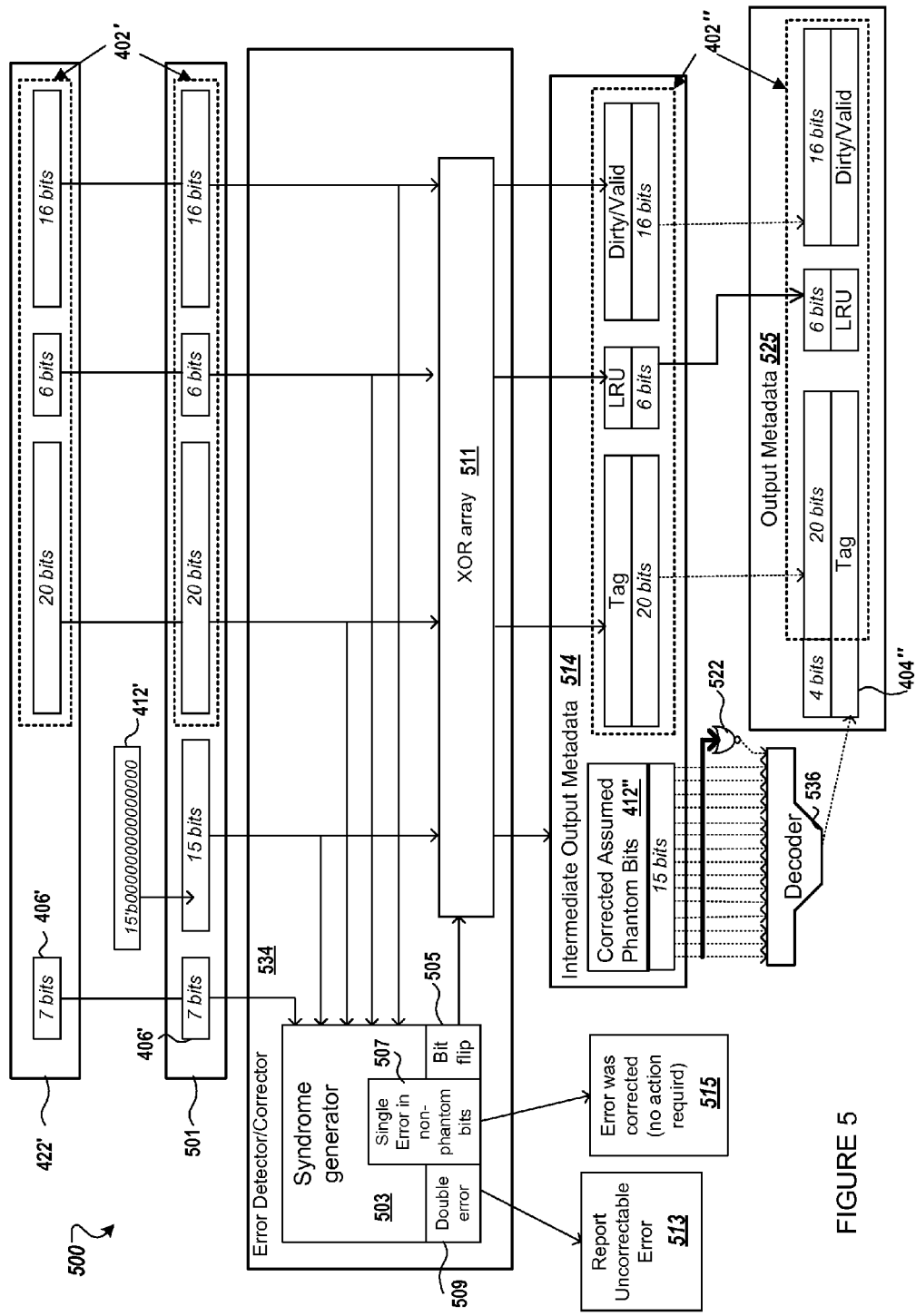
FIG. 5 is a data flow diagram for cache metadata as a memory storage example of the functioning of the data decoding circuit of FIG. 1C.

FIG. 5 is a data flow diagram 500 for cache metadata as a memory storage example of the functioning of the data decoding circuit 130 of FIG. 1C. A first code word 422' may include a plurality of retrieved ECC bits 106' and a plurality of retrieved primary bits 102' as retrieved from the SRAM entry 422 (from FIG. 4). Errors may have occurred during storage and retrieval such that the retrieved code word 422' may not be an exact match for stored code word 422. A second code word 501 may be formed by adding a plurality of assumed phantom bits 412' to the first code word.

The error detector and corrector 534 may then receive the ECC bits 406', the assumed phantom bits 412' and the plurality of received primary bits 102', e.g., the 20 tag bits, the 6 LRU bits and the 16 dirty/valid bits (or in the other words, the second code word 501). The assumed phantom bits 412' may be presumed to be all zeroes as illustrated, although other combinations of phantom bits may be presumed. The presumed value has certain properties, such as at most being a single bit flip different from any of the possible values of phantom bits 412.

A syndrome generator 503 of the error detector and corrector 534 may then direct a bit flip 505 on the assumed phantom bits 412' when the calculation by the syndrome generator 503 using ECC bits 406' indicates that the presumption was wrong, and that one of the assumed phantom bits 412' should be a one ("1"). When all of the assumed phantom bits 412' are correctly presumed to be all be zero, no correction is needed.

When all of the additional bits 404 (FIG. 4) are 0000 (e.g., corresponding, per Table 1, to phantom bits whose value is identical to the assumed values for the phantom bits 412'), the syndrome generator 503 may retain full SECDED capability. For example, the syndrome generator 503 may indicate the detection of a single error in the non-phantom bits (507) or the detection of a double error in the non-phantom bits (509). When detecting the single error, the syndrome generator 503 may report (or otherwise indicate) that the syndrome generator 503 has instructed the XOR array 511 to correct the error in the retrieved primary bits 402' without need for further action (515). When detecting a double error, the syndrome generator 503 may report (or otherwise indicate) an uncorrectable error (513), which may be handled with a flag, interrupt or other request to obtain the corrected data, e.g., to trigger a fetch from external memory.

When one of the phantom bits 412 is a "one" and thus the assumed values of the phantom bits 412' are in error (as is the case most of the cases of the encoding of Table 1), the syndrome generator 503 may still detect a single error in the retrieved primary bits 402' as a two-bit error in the second code word 501 (two errors resulting, one in the assumed phantom bits 412' and the other in the retrieved primary bits 402') so that the component or device may react to that error in the primary bits (e.g., triggering a fetch of the correct from external memory).

An XOR array 511 of the error detector and corrector 534 may receive the assumed phantom bits 412' and the retrieved primary bits 402', including the 20 tag bits, the 6 LRU bits and the 16 dirty/valid bits of the cache metadata. The syndrome generator 503 may then direct any correction on these bits within the XOR array 511 before being output as intermediate output metadata 514, including corrected phantom bits 412" and corrected primary bits 402".

A decoder 536 (in this case a 16-to-4 one-hot decoder) may decode the corrected phantom bits 412" to generate a plurality of derived additional bits 404" that may be output with output metadata 525 in response to an SRAM entry request. The output metadata 525 may include the derived additional bits 404" and a plurality of corrected primary bits 402", to include the entire 24 tag bits, 6 LRU bits and 16 dirty/valid bits of the cache metadata 401. The decoder 536 may include a NOR gate 522, having as inputs the 15 corrected assumed phantom bits 412", to supply the least significant bit of the inputs for the decoder 536. In other words, a zero output value of the additional bits may be recreated as a NOR of the assumed phantom bits 412". The decoder 536 may also detect nonsensical values for the corrected assumed phantom bits 412" (such as multiple bits being '1') and which may indicate an undetected error in the code-word (for example, resulting from more than two errors). This indication may be used to trigger a fetch from external memory.

Figure 6:
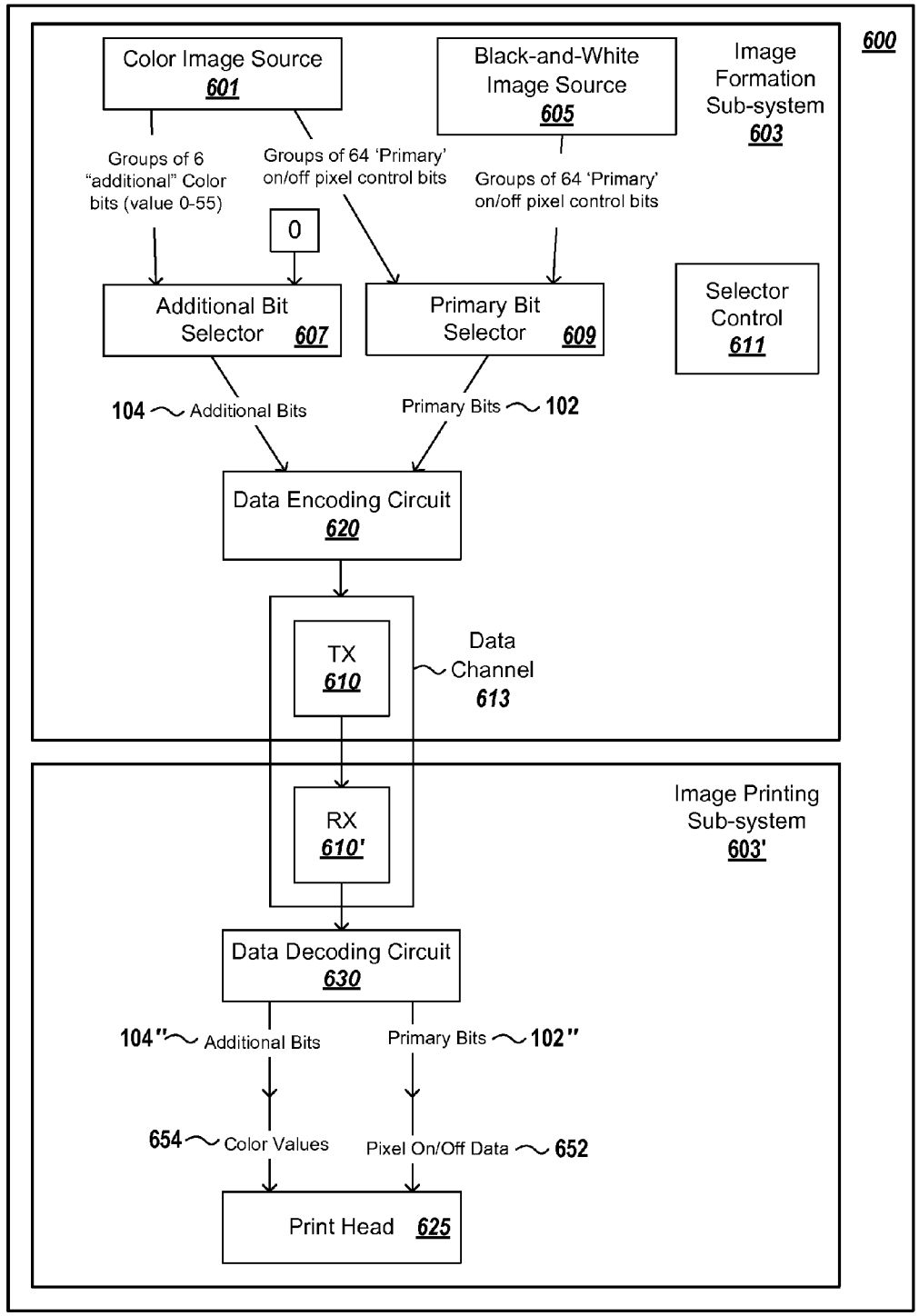
FIG. 6 is a data flow diagram for data transmission and reception of data representing bit map images where the additional bits may be used to represent color data.

FIG. 6 is a block diagram of an example system 600 with high-level system architecture that forms an image for printing in an image formation sub-system 603 and delivers it to the image printing sub-system 603'. The image formation sub-system 603 may include a color image source 601, a black-and-white image source 605, an additional bit selector 607, a primary bit selector 609, a selector control 611, and a data encoding circuit 620. The data encoding circuit 620 may encode a plurality of primary bits 102 and a plurality of additional bits 104 into a code word for transmission.

The image printing sub-system 603' may include a print head 625 and a data decoding circuit 630. The data decoding circuit 630 may decode the transmitted code word, after reception, into a plurality of corrected received primary bits 102" and a plurality of derived bits 104". The corrected received primary bits 102" may form 64-bit pixel on/off data 652 sent to the print head 625, and the derived additional bits 104" may form color value(s) 654 sent to the print head, as will be discussed in more detail. A data channel 613 may span or otherwise link the image formation sub-system 603 and the image printing sub-system 603' through which is transmitted the code word. When transmitted through the data channel 613, the code word may incur one or more errors.

More specifically, the system 600 may have been originally designed to carry black-and-white image data (say legal text) from the black-and-white image source 605 with high reliability. The data encoding circuit 620 may have been used to apply a code capable of SECDED for the data as it passed through data channel 613, such that single bit errors in the black-and-white data could be corrected by the data decoding circuit 630 in the image printing sub-system 603'.

In one embodiment, designers may have wanted to allow color printing capabilities to the system without change to the data channel 613 (for example, the data channel 613 may represent a flexible connection between a non-moving image formation sub-system 603 and a movable image printing sub-system 603' that was incorporated into a scanning print head). The system 600 may have been designed such that color images would be transferred simply for embellishment of the printed documents, and, unlike black-and-white images, would carry no legal implication of incorrect printing. Thus, a design choice may have existed that, when color parts of the print image are sent across data channel 613, there is no need for SECDED capability.

Figure 7:
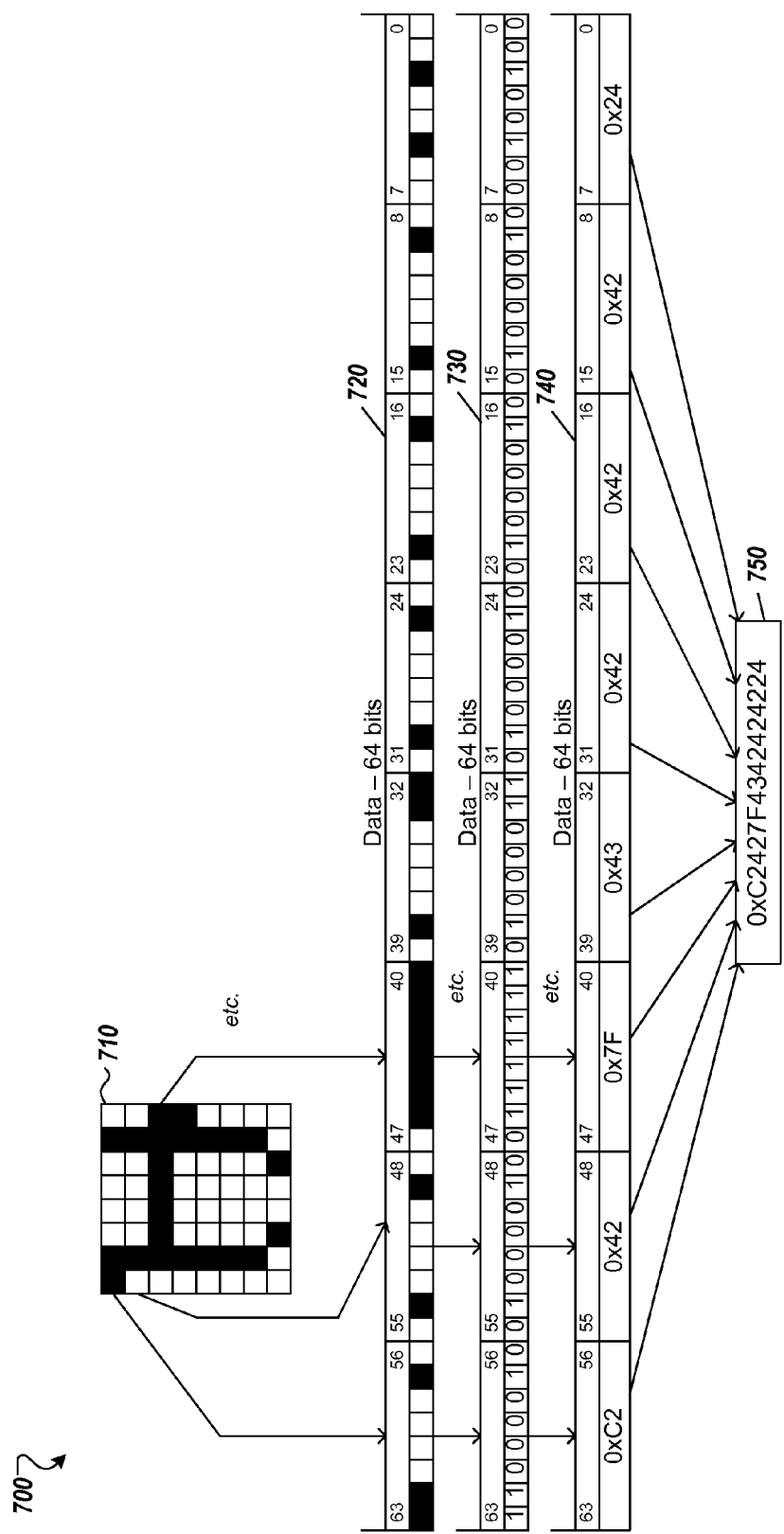
FIG. 7 is a diagram illustrating the representation of bit map images as data values of FIG. 6.

As illustrated by FIG. 7, a matrix of 8-by-8 pixels may be represented by a 64-bit data value. The system of FIG. 6, as originally designed, may have transferred black-and-white image data as groups of 8-by-8 pixels, with on/off indication for each pixel by sending a 64-bit data value for each group of 8-by-8 pixels. The system of FIG. 6, as originally designed may also have protected the integrity of these pixel values by assigning an 8-bit ECC value to provide SECDED error protection of the 64-bit data value.

It may be desirable, therefore, in order to transfer color images to the image printing sub-system 603', to accompany each group of 8-by-8 pixels with a value for chosen color, say colors numbered 1 to 56 (with a value of zero representing no color (e.g., black)) and to send this color value (or the option of no color) from the image formation sub-system 603 to the image printing sub-system 603'. The scheme may be arranged such that when a color is selected, any pixels in the 8-by-8 matrix that were to be printed black (this by virtue of their respective bit in the 64-bit value being a one ("1")) would instead be printed in the selected color.

The choice of non-black color may be encoded into a one-hot array of 56 phantom bits, consisting of bits [119:64], to sit alongside the existing 64-bit data representing the matrix of 8-by-8 pixels, bits [63:0]. For example, to indicate color n for the 8-by-8 matrix, bit (63+n) will contain the binary value '1', and all other bits in the range [119:64] will contain the binary value zero. To indicate that the 8-by-8 matrix is to be printed in black, no color may be selected, and all bits in the range [119:64] may contain the binary value zero.

The image formation sub-system 603 illustrates the selective combination of the black-and-white image source 605 and the color image source 601 to produce a combined image where some areas are black-and-white and others are color. Each group of 8-by-8 pixels may be selected to come from either the black-and-white image source 605 or the color image source 601. The primary bit selector 609 and the additional bit selector 607 operate under the control of the selector control 611.

When the selector control 611 decides that part of the combined image is to come from the black-and-white image source 605, the selector control 611 may cause the primary bit selector 609 to drive the 64-bit value representing a group of 8-by-8 pixels from the black-and-white image source 605 on the primary bits 102 sent to the data encoding circuit 620. When the selector control 611 has selected a group of 8-by-8 pixels from the color image source 601, the selector control 611 may cause the primary bit selector 609 to drive the 64-bit value representing a group of 8-by-8 pixels from the color source 601 on the primary bits 102 sent to the data encoding circuit 620

Likewise, when the selector control 611 decides that part of the combined image is to come from the black-and-white image source 605, the selector control 611 may cause the additional bit selector 607 to drive a value of 0, representing no color (or black), on the additional bits 104 sent to data encoding circuit 620. When the selector control 611 decides that part of the combined image is to come from the color image source 601, the selector control 611 may cause the additional bit selector 607 to drive the color value provided by the color image source 601 within the additional bits 104 to be sent to the data encoding circuit 620.

The additional bits 104 may include six binary digits in this example, however, only binary values representing 0 (black) and 1-56 (various colors, e.g., 1=red, 2=light red, 3=pink . . . etc.) may be driven onto be a part of the additional bits 104. Binary values representing 57-63 may not be used.

The data encoding circuit 620 may perform ECC bit generation based on the 120-bit value that contains the 56 phantom bits together with the 64 bits representing on/off values for the matrix of the 8-by-8 pixels. The resulting eight-bit ECC field may be no larger than the ECC field that was previously necessary to protect only the 64 bits representing on/off values for the matrix of the 8-by-8 pixels. Thus, the eight-bit ECC field and the 64 bits representing on/off values for the matrix of 8-by-8 pixels may be sent as a 72-bit code word across the data channel 613 that is unmodified from the data channel of the system originally designed to only handle black-and-white images.

Referring now to the image printing sub-system 603', the data decoding circuit 630 may assume a value of 56 binary zeros for the 56 phantom bits. By virtue of the one-hot encoding of the color choice onto the phantom bits in data encoding circuit 620 of the image formation sub-system 603, this assumed value will be, at most, in error by one bit from the phantom bits of data encoding circuit 620. Thus, we may avoid the need to change the data channel 613 to accommodate the additional bit 104 or the derived phantom bits, and instead rely on the error correction capabilities of the ECC mechanism to correct the potential single error in the assumed phantom bits.

Error detection and correction may be performed by the data decoding circuit 630 by applying ECC SECDED principles to the combination of the 72-bit code word received from the channel and the 56 assumed phantom bits. Once error correction has been applied, the data decoding circuit 630 derives the additional bits as a 6-bit field of values 0 (black) or 1-56 (various colors) from the corrected assumed phantom bits by a reverse of the one-hot and no-hot coding methodology used to create the phantom bits in data encoding circuit 620. The data decoding circuit 630 outputs the corrected primary bits 102" and the derived additional bits 104".

Thus, use of the data encoding circuit 620 in the image formation sub-system 603 and use of the data decoding circuit 630 in the image printing sub-system 603' maintain the ability for the correction of all single bit errors occurring in the data channel 613 for black-and-white images (Color=0), while allowing the extraction of color selection (Color=1 to 56) for Color Image Sources without single bit error correction for the color images.

The corrected received primary bits 102" may form blocks of 64-bit pixel on/off data 652 sent to the print head 625, and the derived additional bits 104" form the color value 654 for each block sent to the print head. The print head 625 may be responsible for printing each 8-by-8 pixel block by ejecting ink in the appropriate location of the 8-by-8 matrix according to the pixel on/off data 652, and with the color of ink selected by color value(s) 654 (with the value of 0 representing the selection of black ink, and values of 1-56 representing different color inks).

FIG. 7 is a diagram 700 representing the formation of 64-bit pixel on/off data, such as that forms the primary bits 102 and corrected primary bits 102" of decoded data sent to the print head, after correction (FIG. 6). A matrix of 8-by-8 pixels 710 represents part of an image. Pixels, represented by cells in this matrix may be "on" (to be inked) or "off" (no ink to be applied). For example, in the top row of this 8-by-8 matrix, the two left-most pixels are to be inked and the four center-most pixels are not to be inked. The on/off values of the rows of the matrix 710 may be rearranged as a series of abutting slices 720, where the position of each cell may be numbered from 0 to 63, with the right-most cell numbered zero.

With further reference to FIG. 7, binary values 0 and 1 may be substituted for the on/off values of the series of abutting slices 720, to create a 64-bit binary value 730 representing pixel on/off data. The 64-bit binary value 730 may also be represented as a series of eight 2-digit hexadecimal values 740 or as a 16-digit hexadecimal value 750. The 64-bit binary value 730, the series of eight 2-digit hexadecimal values 740 or the 16-digit hexadecimal value 750 may form alternate representations of the matrix of 8-by-8 pixels 710, the specific values of 64-bit binary value 730, the series of eight 2-digit hexadecimal values 740 or the 16-digit hexadecimal value 750 changing to represent different patterns of on/off pixels of the matrix of 8-by-8 pixels 710. The 64-bit binary value 730, the series of eight 2-digit hexadecimal values 740 or the 16-digit hexadecimal value 750 illustrate how the primary bits 102 and corrected received primary bits 102" may represent a matrix of 8-by-8 pixels in various embodiments.

Figure 8:
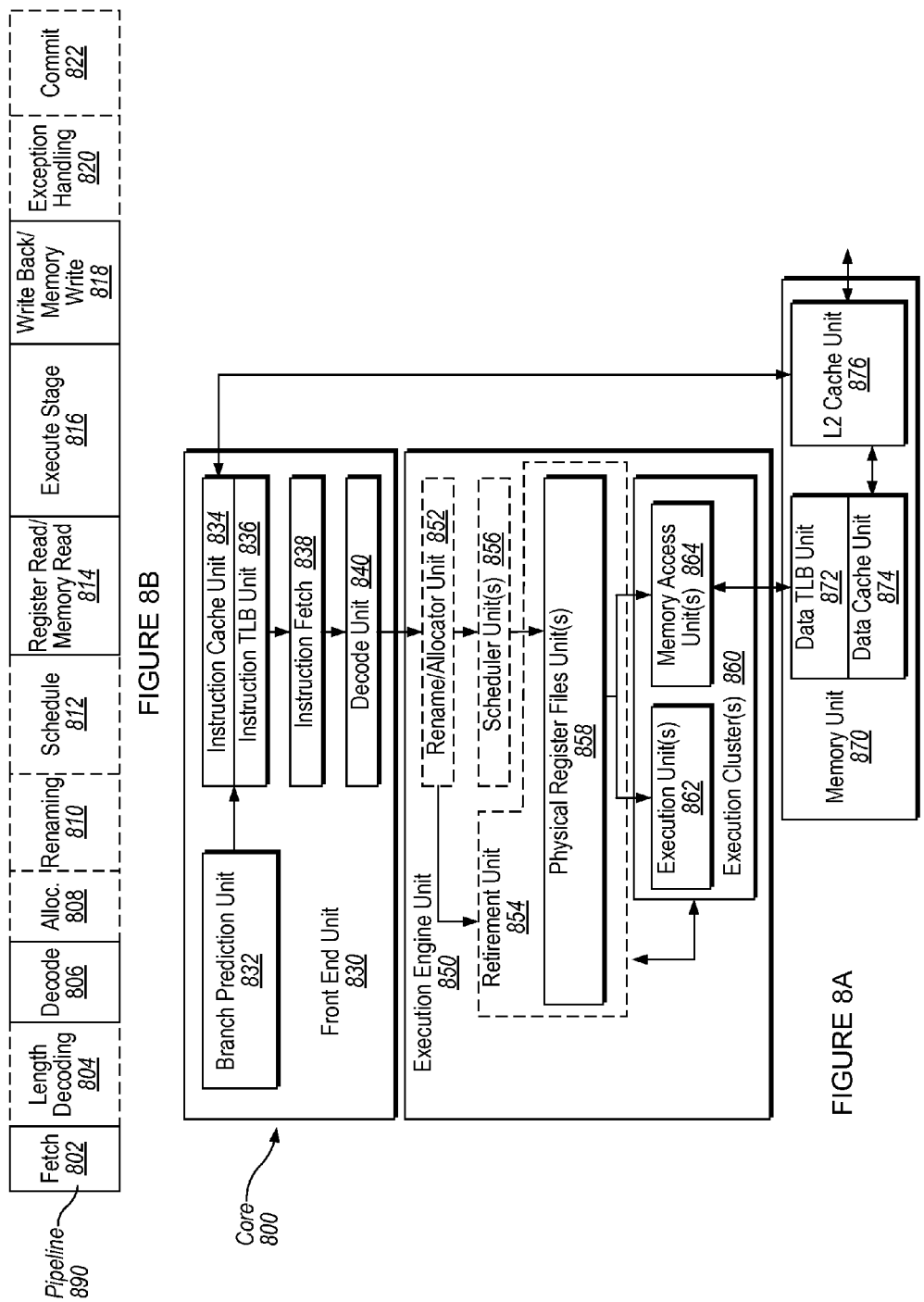
FIG. 8A is a block diagram illustrating a micro-architecture for a processor that employs error correcting code to carry additional bits according to one embodiment.
FIG. 8B is a block diagram illustrating an in-order pipeline and a register renaming stage, out-of-order issue/execution pipeline according to one embodiment.

FIG. 8A is a block diagram illustrating a micro-architecture for a processor core 800 that may employ error correcting code to carry additional bits according to one embodiment. Specifically, processor core 800 depicts an in-order architecture core and a register renaming logic, out-of-order issue/execution logic to be included in a processor according to at least one embodiment of the disclosure. The embodiments of the error correcting code that carry additional bits may be implemented by processor core 800.

The processor core 800 includes a front end unit 830 coupled to an execution engine unit 850, and both are coupled to a memory unit 870. The processor core 800 may include a reduced instruction set computing (RISC) core, a complex instruction set computing (CISC) core, a very long instruction word (VLIW) core, or a hybrid or alternative core type. As yet another option, processor core 800 may include a special-purpose core, such as, for example, a network or communication core, compression engine, graphics core, or the like. In one embodiment, processor core 800 may be a multi-core processor or may be part of a multi-processor system.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (also known as a decoder) may decode instructions, and generate as an output one or more micro-operations, micro-code entry points, microinstructions, other instructions, or other control signals, which are decoded from, or which otherwise reflect, or are derived from, the primary instructions. The decoder 840 may be implemented using various different mechanisms. Examples of suitable mechanisms include, but are not limited to, look-up tables, hardware implementations, programmable logic arrays (PLAs), microcode read only memories (ROMs), etc. The instruction cache unit 834 is further coupled to the memory unit 870. The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations (RS), central instruction window, etc. The scheduler unit(s) 856 may be coupled to the physical register file unit(s) 858. Each of the physical register file unit(s) 858 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 858 may be overlapped by the retirement unit 854 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/ packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 may be coupled to the memory unit 870, which may include a data prefetcher 880, a data TLB unit 872, a data cache unit (DCU) 874, and a level 2 (L2) cache unit 876, to name a few examples. In some embodiments DCU 874 is also known as a first level data cache (L1 cache). The DCU 874 may handle multiple outstanding cache misses and continue to service incoming stores and loads. It also supports maintaining cache coherency. The data TLB unit 872 is a cache used to improve virtual address translation speed by mapping virtual and physical address spaces. In one exemplary embodiment, the memory access units 864 may include a load unit, a store address unit, and a store data unit, each of which is coupled to the data TLB unit 872 in the memory unit 870. The L2 cache unit 876 may be coupled to one or more other levels of cache and eventually to a main memory.

In one embodiment, the data prefetcher 880 speculatively loads/prefetches data to the DCU 874 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor core 800 may support one or more instructions sets (e.g., the x86 instruction set (with some extensions that have been added with newer versions); the MIPS instruction set of Imagination Technologies of Kings Langley, Hertfordshire, UK; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 8B is a block diagram illustrating an in-order pipeline and a register renaming stage, out-of-order issue/execution pipeline implemented by processor core 800 of FIG. 8A according to some embodiments of the disclosure. The solid lined boxes in FIG. 8B illustrate an in-order pipeline, while the dashed lined boxes illustrates a register renaming, out-of-order issue/execution pipeline. In FIG. 8B, a processor pipeline 890 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824. In some embodiments, the ordering of stages 802-824 may be different than illustrated and are not limited to the specific ordering shown in FIG. 8B.

Figure 9:
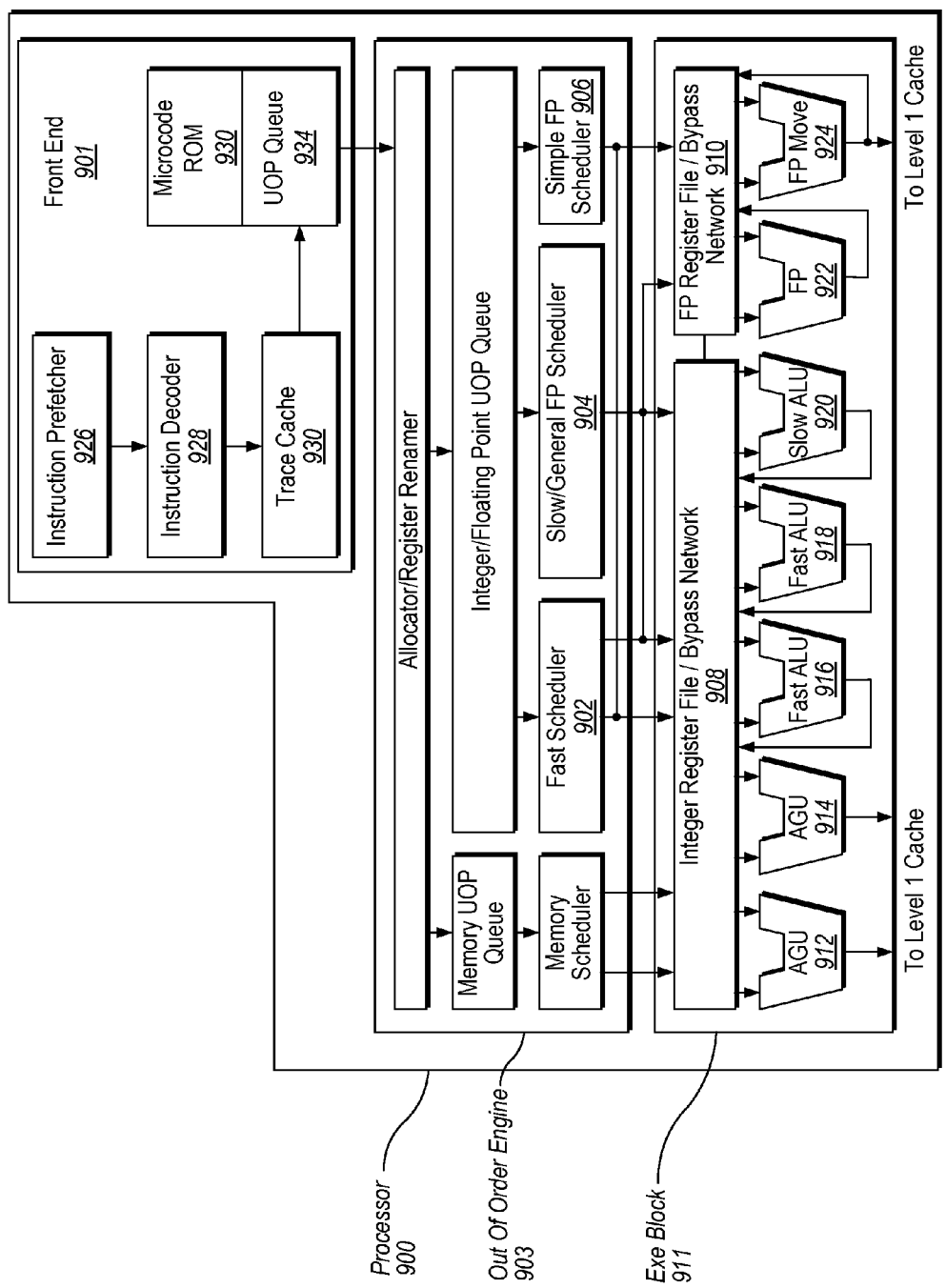
FIG. 9 illustrates a block diagram of the micro-architecture for a processor that includes logic circuits to employ error correcting code to carry additional bits according to one embodiment.

FIG. 9 illustrates a block diagram of the micro-architecture for a processor 900 that includes logic circuits that may employ error correcting code to carry additional bits according to one embodiment. In some embodiments, an instruction in accordance with one embodiment may be implemented to operate on data elements having sizes of byte, word, doubleword, quadword, etc., as well as datatypes, such as single and double precision integer and floating point datatypes. In one embodiment the in-order front end 901 is the part of the processor 900 that fetches instructions to be executed and prepares them to be used later in the processor pipeline. The embodiments that employ error correcting code to carry additional bits may be implemented by processor 900.

The front end 901 may include several units. In one embodiment, the instruction prefetcher 916 fetches instructions from memory and feeds them to an instruction decoder 918 which in turn decodes or interprets them. For example, in one embodiment, the decoder decodes a received instruction into one or more operations called "micro-instructions" or "micro-operations" (also called micro op or uops) that the machine may execute. In other embodiments, the decoder parses the instruction into an opcode and corresponding data and control fields that are used by the micro-architecture to perform operations in accordance with one embodiment. In one embodiment, the trace cache 930 takes decoded uops and assembles them into program ordered sequences or traces in the uop queue 934 for execution. When the trace cache 930 encounters a complex instruction, the microcode ROM (or RAM) 932 may provide the uops needed to complete the operation.

Some instructions are converted into a single micro-op, whereas others need several micro-ops to complete the full operation. In one embodiment, if more than four micro-ops are needed to complete an instruction, the decoder 918 accesses the microcode ROM 932 to do the instruction. For one embodiment, an instruction may be decoded into a small number of micro ops for processing at the instruction decoder 918. In another embodiment, an instruction may be stored within the microcode ROM 932 should a number of micro-ops be needed to accomplish the operation. The trace cache 930 refers to an entry point programmable logic array (PLA) to determine a correct micro-instruction pointer for reading the micro-code sequences to complete one or more instructions in accordance with one embodiment from the micro-code ROM 932. After the microcode ROM 932 finishes sequencing micro-ops for an instruction, the front end 901 of the machine resumes fetching micro-ops from the trace cache 930.

The out-of-order execution engine 903 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 902, slow/general floating point scheduler 904, and simple floating point scheduler 906. The uop schedulers 902, 904, 906, determine when a uop is ready to execute based on the readiness of their dependent input register operand sources and the availability of the execution resources the uops need to complete their operation. The fast scheduler 902 of one embodiment may schedule on each half of the main clock cycle while the other schedulers may only schedule once per main processor clock cycle. The schedulers arbitrate for the dispatch ports to schedule uops for execution.

Register files 908, 910, sit between the schedulers 902, 904, 906, and the execution units 912, 914, 916, 918, 920, 922, 924 in the execution block 911. There is a separate register file 908, 910, for integer and floating point operations, respectively. Each register file 908, 910, of one embodiment also includes a bypass network that may bypass or forward just completed results that have not yet been written into the register file to new dependent uops. The integer register file 908 and the floating point register file 910 are also capable of communicating data with the other. For one embodiment, the integer register file 908 is split into two separate register files, one register file for the low order 32 bits of data and a second register file for the high order 32 bits of data. The floating point register file 910 of one embodiment has 128 bit wide entries because floating point instructions typically have operands from 64 to 128 bits in width.

The execution block 911 contains the execution units 912, 914, 916, 918, 920, 922, 924, where the instructions are actually executed. This section includes the register files 908, 910, that store the integer and floating point data operand values that the micro-instructions need to execute. The processor 900 of one embodiment is comprised of a number of execution units: address generation unit (AGU) 912, AGU 914, fast ALU 916, fast ALU 918, slow ALU 920, floating point ALU 922, floating point move unit 914. For one embodiment, the floating point execution blocks 922, 924, execute floating point, MMX, SIMD, and SSE, or other operations. The floating point ALU 922 of one embodiment includes a 64-bit-by-64-bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 916, 918. The fast ALUs 916, 918, of one embodiment may execute fast operations with an effective latency of half a clock cycle. For one embodiment, most complex integer operations go to the slow ALU 920 as the slow ALU 920 includes integer execution hardware for long latency type of operations, such as a multiplier, shifts, flag logic, and branch processing. Memory load/store operations are executed by the AGUs 912, 914. For one embodiment, the integer ALUs 916, 918, 920, are described in the context of performing integer operations on 64 bit data operands. In alternative embodiments, the ALUs 916, 918, 920, may be implemented to support a variety of data bits including 16, 32, 128, 256, etc. Similarly, the floating point units 922, 924, may be implemented to support a range of operands having bits of various widths. For one embodiment, the floating point units 922, 924, may operate on 128 bits wide packed data operands in conjunction with SIMD and multimedia instructions.

In one embodiment, the uops schedulers 902, 904, 906, dispatch dependent operations before the parent load has finished executing. As uops are speculatively scheduled and executed in processor 900, the processor 900 also includes logic to handle memory misses. If a data load misses in the data cache, there may be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein may be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, may operate with packed data elements that accompany SIMD and SSE instructions. Similarly, 128 bits wide XMM registers relating to SSE2, SSE3, SSE4, or beyond (referred to generically as "SSEx") technology may also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 10:
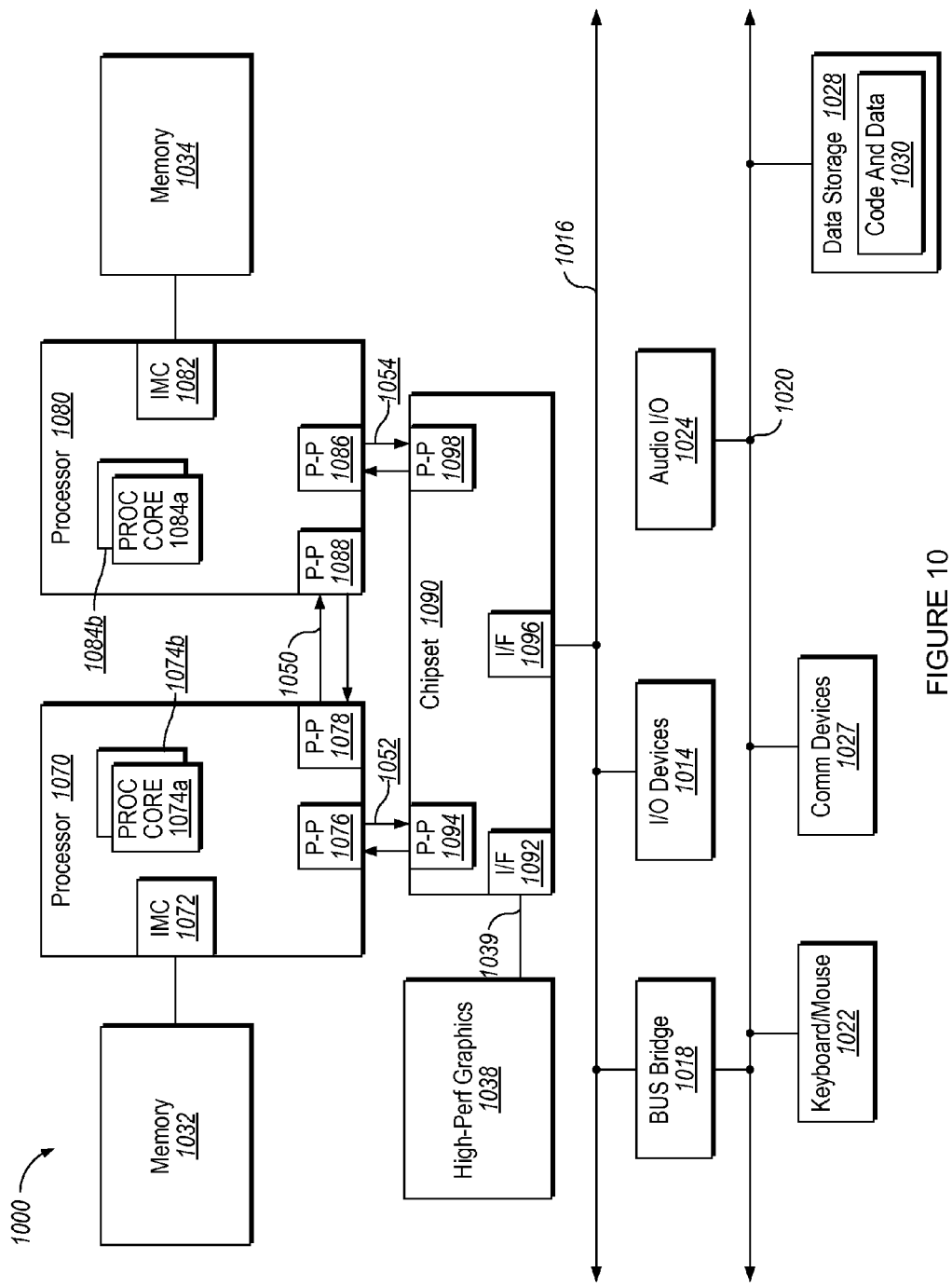
FIG. 10 is a block diagram of a computer system according to one implementation.
Figure 11:
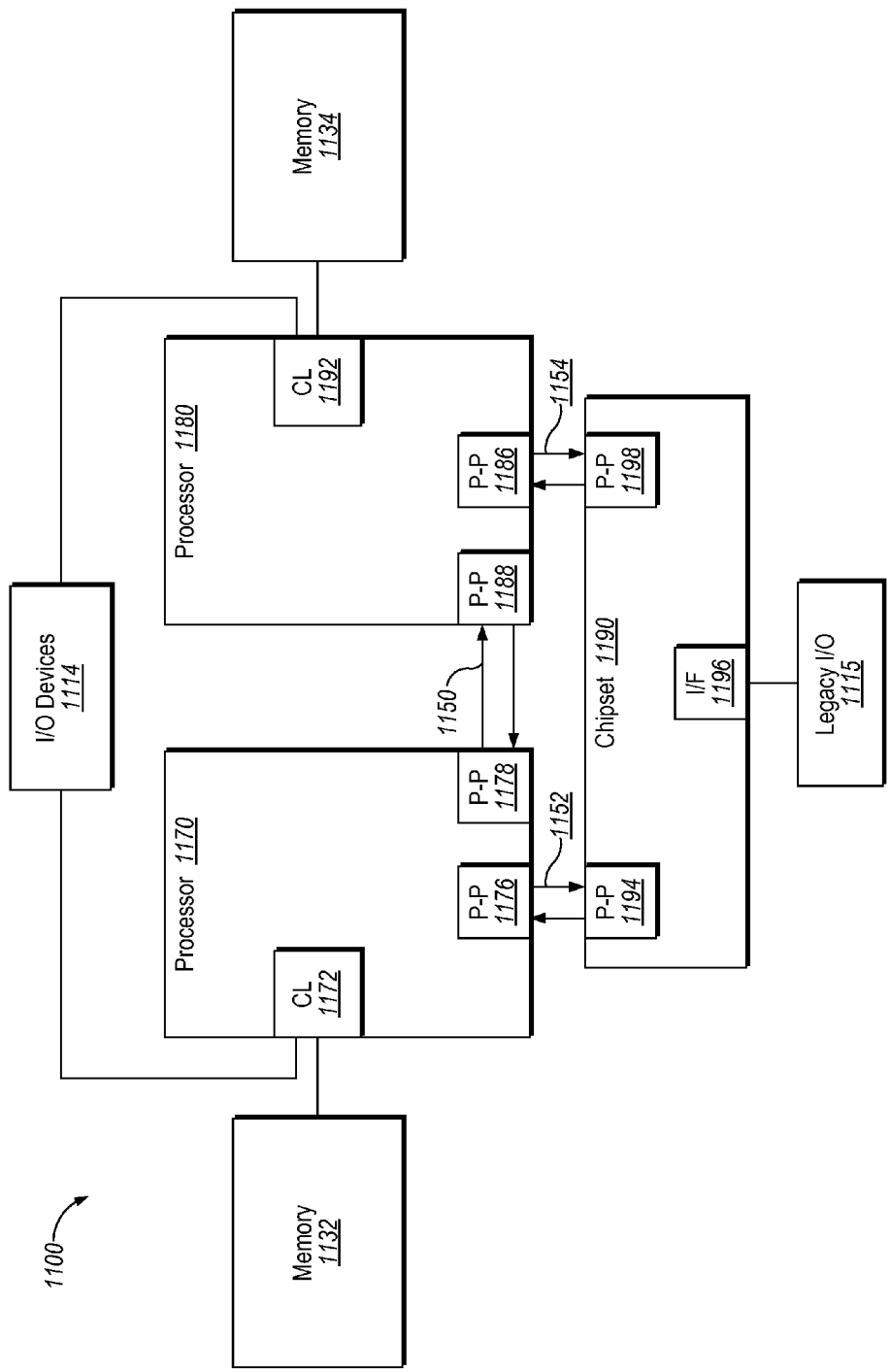
FIG. 11 is a block diagram of a computer system according to another implementation.

Embodiments may be implemented in many different system types. Referring now to FIG. 10, shown is a block diagram of a multiprocessor system 1000 in accordance with an implementation. As shown in FIG. 11, multiprocessor system 1000 is a point-to-point interconnect system, and includes a first processor 1070 and a second processor 1080 coupled via a point-to-point interconnect 1050. As shown in FIG. 10, each of processors 1070 and 1080 may be multicore processors, including first and second processor cores (i.e., processor cores 1074a and 1074b and processor cores 1084a and 1084b), although potentially many more cores may be present in the processors. The processors each may include hybrid write mode logics in accordance with an embodiment of the present. The embodiments that employ error correcting code to carry additional bits may be implemented in the processor 1070, processor 1080, or both.

While shown with two processors 1070, 1080, it is to be understood that the scope of the present disclosure is not so limited. In other implementations, one or more additional processors may be present in a given processor.

Figure 13:
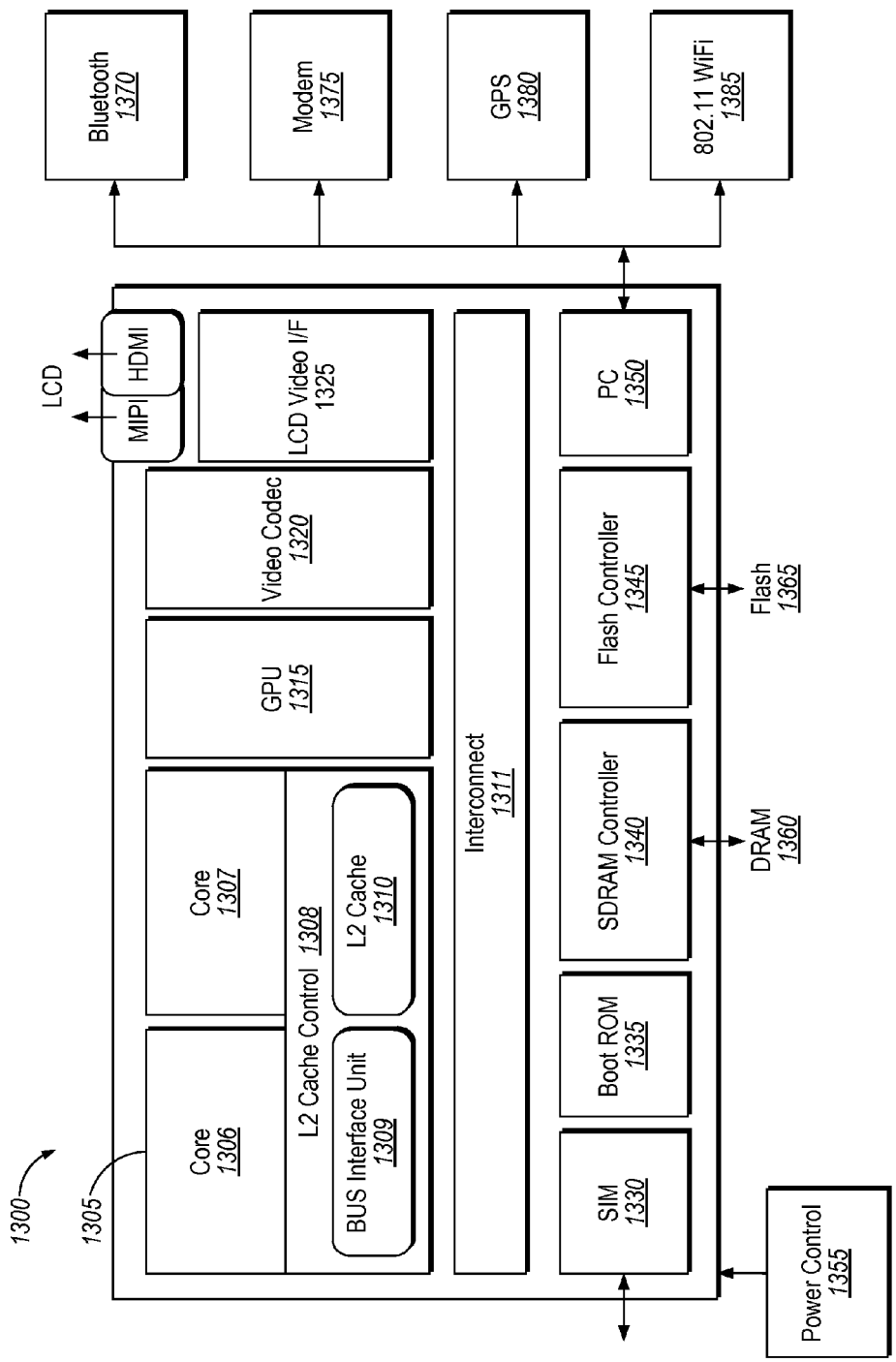
FIG. 13 illustrates another implementation of a block diagram for a computing system.

Processors 1070 and 1080 are shown including integrated memory controller units 1072 and 1082, respectively. Processor 1070 also includes as part of its bus controller units point-to-point (P-P) interfaces 1076 and 1088; similarly, second processor 1080 includes P-P interfaces 1086 and 1088. Processors 1070, 1080 may exchange information via a point-to-point (P-P) interface 1050 using P-P interface circuits 1078, 1088. As shown in FIG. 13, IMCs 1072 and 1082 couple the processors to respective memories, namely a memory 1032 and a memory 1034, which may be portions of main memory locally attached to the respective processors.

Processors 1070, 1080 may each exchange information with a chipset 1090 via individual P-P interfaces 1052, 1054 using point to point interface circuits 1076, 1094, 1086, 1098. Chipset 1090 may also exchange information with a high-performance graphics circuit 1038 via a high-performance graphics interface 1039.

A shared cache (not shown) may be included in either processor or outside of both processors, yet connected with the processors via P-P interconnect, such that either or both processors' local cache information may be stored in the shared cache if a processor is placed into a low power mode.

Chipset 1090 may be coupled to a first bus 1016 via an interface 1096. In one embodiment, first bus 1016 may be a Peripheral Component Interconnect (PCI) bus, or a bus such as a PCI Express bus or another third generation I/O interconnect bus, although the scope of the present disclosure is not so limited.

As shown in FIG. 10, various I/O devices 1014 may be coupled to first bus 1016, along with a bus bridge 1018 which couples first bus 1016 to a second bus 1020. In one embodiment, second bus 1020 may be a low pin count (LPC) bus. Various devices may be coupled to second bus 1020 including, for example, a keyboard and/or mouse 1022, communication devices 1027 and a storage unit 1028 such as a disk drive or other mass storage device which may include instructions/code and data 1030, in one embodiment. Further, an audio I/O 1024 may be coupled to second bus 1020. Note that other architectures are possible. For example, instead of the point-to-point architecture of FIG. 13, a system may implement a multi-drop bus or other such architecture.

Referring now to FIG. 11, shown is a block diagram of a third system 1100 in accordance with an embodiment of the present disclosure. Like elements in FIGS. 11 and 12 bear like reference numerals, and certain aspects of FIG. 11 have been omitted from FIG. 10 in order to avoid obscuring other aspects of FIG. 11.

FIG. 11 illustrates that the processors 1170, 1180 may include integrated memory and I/O control logic ("CL") 1172 and 1192, respectively. For at least one embodiment, the CL 1172, 1182 may include integrated memory controller units such as described herein. In addition, CL 1172, 1192 may also include I/O control logic. FIG. 11 illustrates that the memories 1132, 1134 are coupled to the CL 1172, 1192, respectively, and that I/O devices 1114 are also coupled to the control logic 1172, 1192. Legacy I/O devices 1115 are coupled to the chipset 1190. The embodiments of that employ error correcting code to carry additional bits may be implemented in processor 1170, in processor 1180, or in both processors 1170 and 1180.

Figure 12:
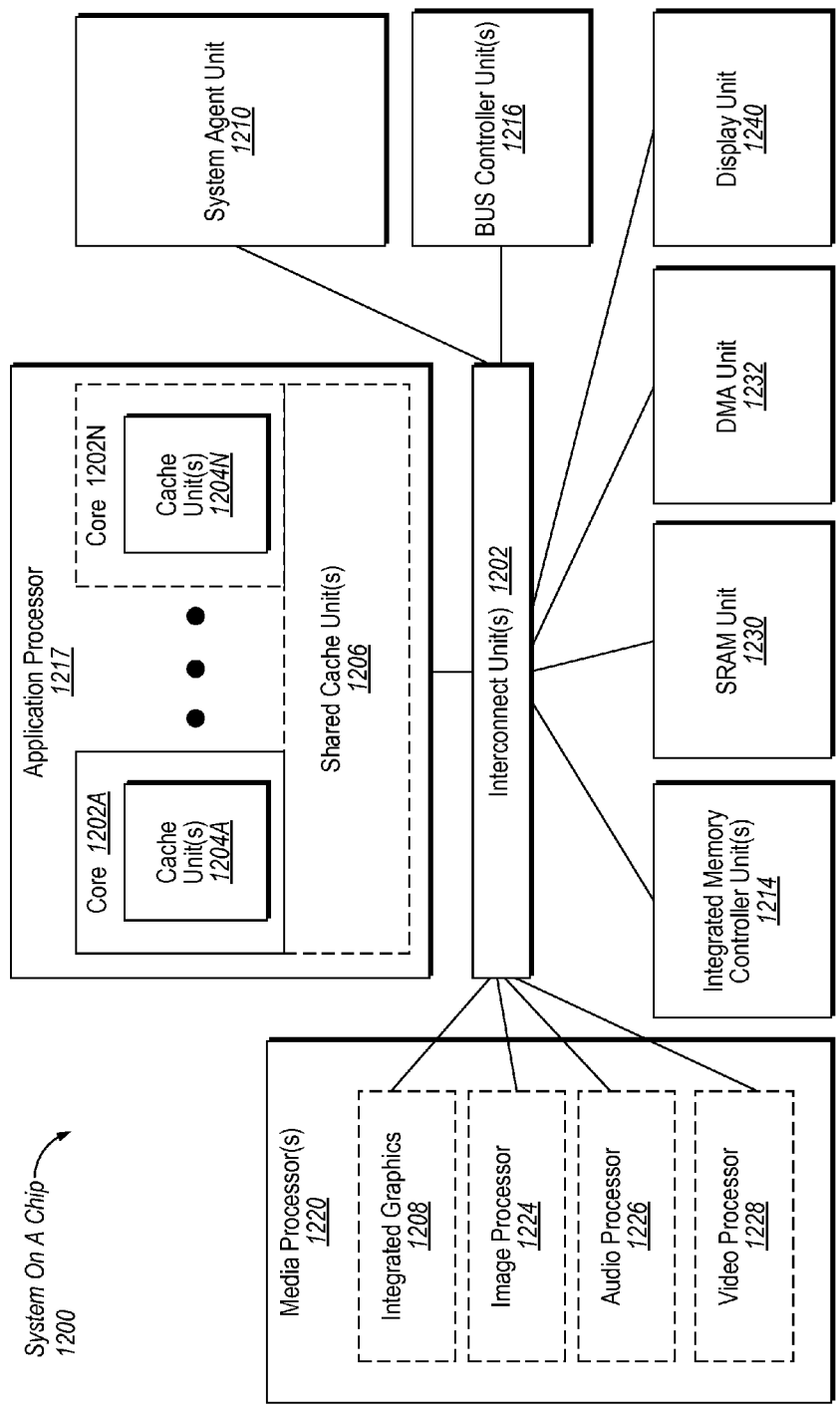
FIG. 12 is a block diagram of a system-on-a-chip according to one implementation.

FIG. 12 is an exemplary system on a chip (SoC) 1200 that may include one or more of the cores 1202. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Within the exemplary SoC 1200 of FIG. 12, dashed lined boxes are features on more advanced SoCs. An interconnect unit(s) 1202 may be coupled to: an application processor 1217 which includes a set of one or more cores 1202A-N and shared cache unit(s) 1206; a system agent unit 1210; a bus controller unit(s) 1216; an integrated memory controller unit(s) 1214; a set or one or more media processors 1220 which may include integrated graphics logic 1208, an image processor 1224 for providing still and/or video camera functionality, an audio processor 1226 for providing hardware audio acceleration, and a video processor 1228 for providing video encode/decode acceleration; a static random access memory (SRAM) unit 1230; a direct memory access (DMA) unit 1232; and a display unit 1240 for coupling to one or more external displays.

Turning next to FIG. 13, an embodiment of a system on-chip (SoC) design in accordance with embodiments of the disclosure is depicted. As an illustrative example, SoC 1300 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which may correspond in nature to a mobile station (MS) in a GSM network. The embodiments that employ error correcting code to carry additional bits may be implemented in SoC 1300.

Here, SoC 1300 includes 2 cores—1306 and 1307. Similar to the discussion above, cores 1306 and 1307 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1306 and 1307 are coupled to cache control 1308 that is associated with bus interface unit 1309 and L2 cache 1310 to communicate with other parts of system 1300. Interconnect 1311 includes an on-chip interconnect, such as an IOSF, AMBA, or other interconnects discussed above, which may implement one or more aspects of the described disclosure.

Interconnect 1311 provides communication channels to the other components, such as a Subscriber Identity Module (SIM) 1330 to interface with a SIM card, a boot ROM 1335 to hold boot code for execution by cores 1306 and 1307 to initialize and boot SoC 1300, a SDRAM controller 1340 to interface with external memory (e.g. DRAM 1360), a flash controller 1345 to interface with non-volatile memory (e.g. Flash 1365), a peripheral control 1350 (e.g. Serial Peripheral Interface) to interface with peripherals, video codecs 1320 and Video interface 1325 to display and receive input (e.g. touch enabled input), GPU 1315 to perform graphics related computations, etc. Any of these interfaces may incorporate aspects of the embodiments described herein.

In addition, the system illustrates peripherals for communication, such as a Bluetooth module 1370, 3G modem 1375, GPS 1380, and Wi-Fi 1385. Note as stated above, a UE includes a radio for communication. As a result, these peripheral communication modules may not all be included. However, in a UE some form of a radio for external communication should be included.

Figure 14:
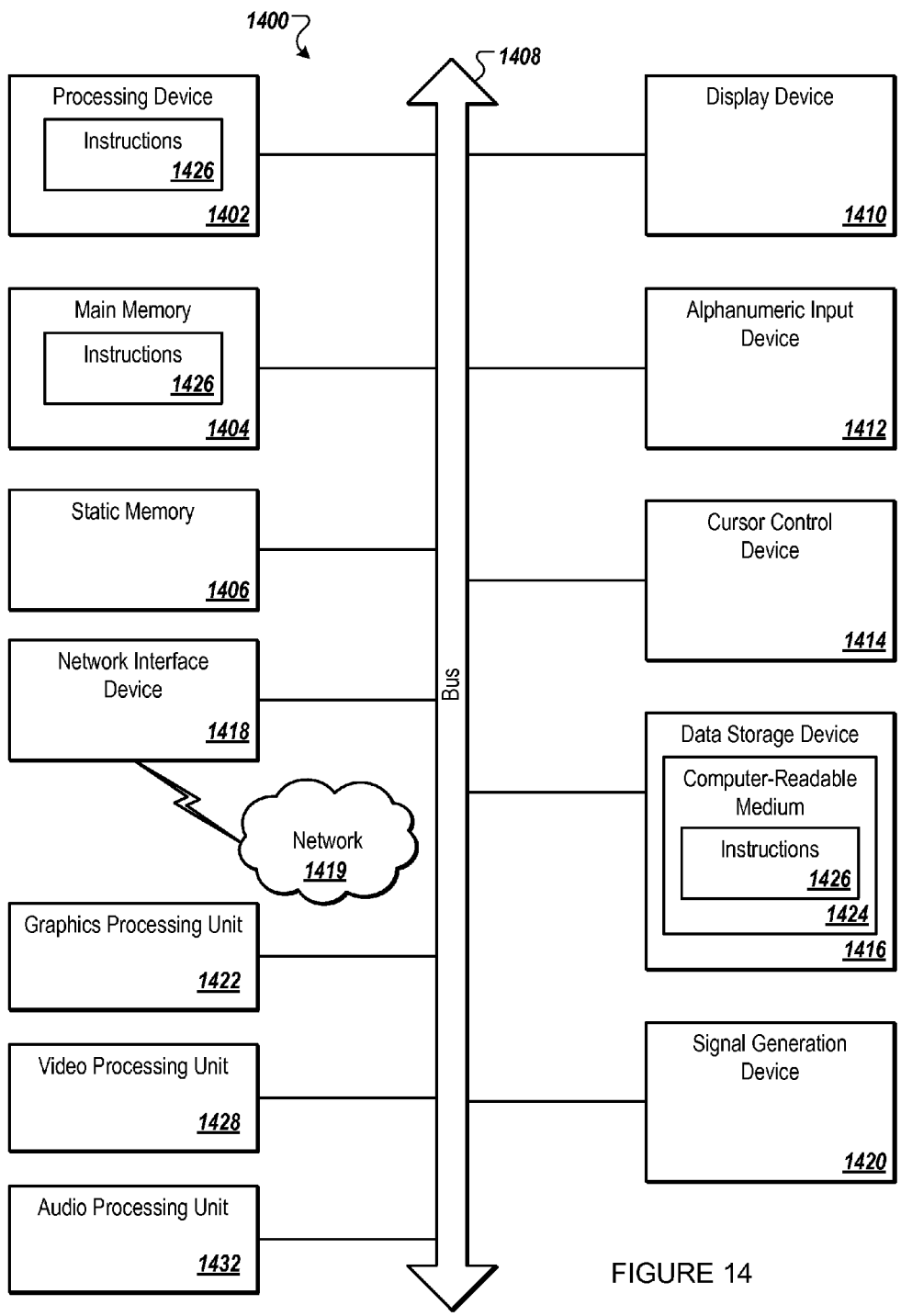
FIG. 14 illustrates another implementation of a block diagram for a computing system.

FIG. 14 illustrates a diagrammatic representation of a machine in the example form of a computing system 1400 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. The embodiments that employ error correcting code to carry additional bits may be implemented in computing system 1400.

The computing system 1400 includes a processing device 1402, main memory 1404 (e.g., flash memory, dynamic random access memory (DRAM) (such as synchronous DRAM (SDRAM) or DRAM (RDRAM), etc.), a static memory 1406 (e.g., flash memory, static random access memory (SRAM), etc.), and a data storage device 1418, which communicate with each other via a bus 1408.

Processing device 1402 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1402 may also be one or more special-purpose processing devices such as an application specific integrated circuit (ASIC), a field programmable gate array (FPGA), a digital signal processor (DSP), network processor, or the like. In one embodiment, processing device 1402 may include one or processor cores. The processing device 1402 is configured to execute the processing logic 1426 for performing the operations discussed herein.

In one embodiment, processing device 1402 may be part of the computing system architecture 100 of FIG. 1. Alternatively, the computing system 1400 may include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1400 may further include a network interface device 1418 communicably coupled to a network 1419. The computing system 1400 also may include a video display device 1410 (e.g., a liquid crystal display (LCD) or a cathode ray tube (CRT)), an alphanumeric input device 1410 (e.g., a keyboard), a cursor control device 1414 (e.g., a mouse), a signal generation device 1420 (e.g., a speaker), or other peripheral devices. Furthermore, computing system 1400 may include a graphics processing unit 1422, a video processing unit 1428 and an audio processing unit 1432. In another embodiment, the computing system 1400 may include a chipset (not illustrated), which refers to a group of integrated circuits, or chips, that are designed to work with the processing device 1402 and controls communications between the processing device 1402 and external devices. For example, the chipset may be a set of chips on a motherboard that links the processing device 1402 to very high-speed devices, such as main memory 1404 and graphic controllers, as well as linking the processing device 1402 to lower-speed peripheral buses of peripherals, such as USB, PCI or ISA buses.

The data storage device 1416 may include a computer-readable storage medium 1424 on which is stored software 1426 embodying any one or more of the methodologies of functions described herein. The software 1426 may also reside, completely or at least partially, within the main memory 1404 as instructions 1426 and/or within the processing device 1402 as processing logic during execution thereof by the computing system 1400; the main memory 1404 and the processing device 1402 also constituting computer-readable storage media.

The computer-readable storage medium 1424 may also be used to store instructions 1426 utilizing the processing device 1402, such as described with respect to FIGS. 1A, 1B, 1C and FIG. 2-7, and/or a software library containing methods that call the above applications. While the computer-readable storage medium 1424 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

Example 1 is an integrated circuit comprising: 1) a data encoding circuit to prepare data for error correction, the data encoding circuit further to: a) receive a plurality of first data bits; b) receive a plurality of second data bits; and c) generate an error correcting code (ECC) from a combination of the plurality of first data bits and a plurality of third data bits derived from a conversion of the plurality of second data bits, and 2) processing logic to form a code word from a combination of the ECC and the plurality of first data bits;

wherein a first combination of the plurality of second data bits enables correction of single bit errors and detection of double bit errors in the code word, and wherein a plurality of other combinations of the plurality of second data bits enables detection of single bit errors in the code word.

In Example 2, the integrated circuit of Example 1, wherein the plurality of second data bits comprises additional bits to be encoded within the ECC for later decoding, and wherein the processing logic further to transmit the plurality of first data bits with the code word.

In Example 3, the integrated circuit of Examples 1-2, wherein the data encoding circuit further comprises an encoder to convert the plurality of second data bits to the plurality of third data bits.

In Example 4, the integrated circuit of Examples 1-3, wherein the data encoding circuit further comprises an error correcting code (ECC) generator to: a) generate the ECC; and b) transmit the ECC to be combined with the plurality of first data bits.

In Example 5, the integrated circuit of Examples 1-4, wherein the first combination comprises the plurality of second data bits being all zero ("0"), and wherein the plurality of other combinations comprises at least one bit of the plurality of second bits being a one ("1").

Various embodiments may have different combinations of the structural features described above. For instance, all optional features of the computing system described above may also be implemented with respect to the method or process described herein and specifics in the examples may be used anywhere in one or more embodiments.

Example 6 is an integrated circuit comprising: 1) a data decoding circuit to detect and correct errors in data following reception of transmitted data, wherein the data decoding circuit to: a) receive a first code word, wherein the first code word is derived from: a plurality of first data bits, a plurality of second data bits, and an error correcting code algorithm; b) generate a second code word from the first code word by appending, to the first code word, assumed values of a plurality of third data bits, wherein the plurality of third data bits were derived from a conversion of the plurality of second data bits during data encoding; c) correct single bit errors and detect double bit errors in a first code word portion of the second code word for a first combination of the plurality of third data bits and the plurality of first data bits; d) detect single bit errors in the first code word portion of the second code word for a plurality of other combinations of the plurality of third data bits and the plurality of first data bits; and e) derive from the second code word, as corrected, the plurality of first data bits and the plurality of second data bits.

In Example 7, the integrated circuit of Example 6, wherein the data decoding circuit further to derive from the second code word, as corrected, indications of correctable errors and uncorrectable errors within the second code word.

In Example 8, the integrated circuit of Examples 6-7, wherein the first combination comprises the plurality of third data bits being all zero ("0"), and wherein the plurality of other combinations comprises one bit of the plurality of third data bits being a one ("1").

In Example 9, the integrated circuit of Examples 6-8, wherein the first code word comprises a received version of the plurality of first data bits and an error correcting code (ECC) generated from a combination of the plurality of first data bits and the plurality of third data bits, wherein the assumed values are values for the plurality of third data bits within the first combination, and wherein the data decoding circuit further to: a) execute error detection and correction, using the ECC, on the second code word; and b) output the second code word, as corrected In Example 10, the integrated circuit of Example 9, wherein, to execute the error detection and correction, the data decoding circuit further to: a) correct any single bit errors and detect any double bit errors in the first code word portion when values of the plurality of third data bits correspond to those of the first combination; and b) detect single bit errors in the first code word portion when the values of the plurality of third data bits correspond to those of one of the plurality of other combinations.

In Example 11, the integrated circuit of Example 9, wherein the data decoding circuit further comprises a decoder to: a) decode the plurality of second data bits from the plurality of third data bits, as corrected, wherein the plurality of second data bits are additional bits to be transmitted to a data requesting component with the plurality of first data bits; and b) output the plurality of second data bits with the plurality of first data bits in response to a data request.

Various embodiments may have different combinations of the structural features described above. For instance, all optional features of the processors and methods described above may also be implemented with respect to a system described herein and specifics in the examples may be used anywhere in one or more embodiments Example 12 is a system on a chip (SoC) comprising: 1) a data encoding circuit to prepare data for error correction when being stored in memory, the data encoding circuit to: a) receive a plurality of first data bits and a plurality of second data bits; b) derive a plurality of third data bits from the plurality of second data bits; c) generate an error correcting code (ECC) from the combination of the plurality of first data bits and the plurality of third data bits; and d) output, to store in the memory, a first code word comprising the ECC and the plurality of first data bits; 2) a data decoding circuit to perform error correction on the data read from the memory, the data decoding circuit to: a) retrieve, from the memory, the first code word; b) generate a second code word from the first code word by appending, to the first code word, assumed values of the plurality of third data bits; c) using the ECC, correct single bit errors and detect double bit errors in a first code word portion of the second code word for a first combination of the plurality of third data bits and the plurality of first data bits; d) detect, using the ECC, single bit errors in the first code word portion of the second code word for a plurality of other combinations of the plurality of third data bits and the plurality of first data bits; and e) derive from the second code word, as corrected, the plurality of first data bits and the plurality of second data bits.

In Example 13, the SoC of Example 12, wherein the assumed values correspond to values of the plurality of third data bits within the first combination.

In Example 14, the SoC of Examples 12-13, wherein the data decoding circuit further to derive from the second code word, as corrected, indications of correctable errors and uncorrectable errors within the code word.

In Example 15, the SoC of Examples 12-14, wherein the data encoding circuit further comprises an encoder to convert the plurality of second data bits to the plurality of third data bits, and the plurality of second data bits comprise additional bits to also be provided in response to a read request for the plurality of first data bits.

In Example 16, the SoC of Example 15, wherein the plurality of first data bits and the plurality of second data bits comprise tag bits for memory address metadata In Example 17, the SoC of Example 15, wherein the data decoding circuit further comprises a decoder to: a) decode the plurality of second data bits from the plurality of third data bits; and b) output the plurality of second data bits with the plurality of first data bits in response to the read request.

In Example 18, the SoC of Example 16, wherein a zero output value of the plurality of second data bits is recreated as a NOR of the plurality of third data bits in the encoder.

In Example 19, the SoC of Examples 12-18, wherein the first combination comprises the plurality of third data bits being all zero ("0"), and wherein the plurality of other combinations comprises one bit of the plurality of third data bits being a one ("1")

Various embodiments may have different combinations of the structural features described above. For instance, all optional features of the processors and methods described above may also be implemented with respect to a system described herein and specifics in the examples may be used anywhere in one or more embodiments Example 20 is a method comprising: 1) receiving, by a data encoding circuit that prepares data for error correction before transmission, a plurality of first data bits and a plurality of second data bits; 2) converting the plurality of second data bits to a plurality of third data bits; 3) generating, by the data encoding circuit, an error correcting code (ECC) from a combination of the plurality of first data bits and the plurality of third data bits; and 4) transmitting, by processing logic, a first code word comprising the ECC and the plurality of first data bits in response to a data request; wherein a first combination of the plurality of third data bits and the plurality of first data bits enables, through use of the ECC, correction of single bit errors and detection of double bit errors in the code word, and wherein a plurality of other combinations of the plurality of third data bits and the plurality of first data bits enables, through use of the ECC, detection of single bit errors in the code word.

In Example 21, the method of Example 20, wherein the data bits comprise cache metadata related to storage in cache memory, the method further comprising transmitting the code word to a data requesting component.

In Example 22, the method of Examples 20-21, further comprising: 1) receiving, by a data decoding circuit in response to the data request, the code word, wherein the code word is a first code word; 2) generating a second code word from the first code word by appending, to the first code word, assumed values of the plurality of third data bits; 3) correcting, by the data decoding circuit using the ECC, single bit errors in a first code portion of the second code word and detecting, by the data decoding circuit using the ECC, double bit errors in the first code portion of the second code word for the first combination; 4) detecting, by the data decoding circuit using the ECC, single bit errors in the first code portion of the second code word for the plurality of other combinations; and 5) deriving, from the second code word as corrected by the data decoding circuit, the plurality of first data bits and the plurality of third data bits.

In Example 23, the method of Example 22, further comprising: 1) decoding, by the data decoding circuit, the plurality of second data bits from the plurality of third data bits, the plurality of second data bits comprising additional bits to be provided with the plurality of first data bits; and 2) outputting the plurality of second data bits with the plurality of first data bits in response to the data request.

In Example 24, the method of Examples 21-23, wherein the first combination comprises the plurality of third data bits being all zero ("0"), and wherein the plurality of other combinations comprises one bit of the plurality of third data bits being a one ("1").

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system have not been described in detail in order to avoid unnecessarily obscuring the present disclosure.

The embodiments are described with reference to employing error correcting code to carry additional bits in specific integrated circuits, such as in computing platforms or microprocessors. The embodiments may also be applicable to other types of integrated circuits and programmable logic devices. For example, the disclosed embodiments are not limited to desktop computer systems or portable computers, such as the Intel® Ultrabooks™ computers. And may be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that may perform the functions and operations taught below. It is described that the system may be any kind of computer or embedded system. The disclosed embodiments may especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure may be applied to other types of circuits or semiconductor devices that may benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and may be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible implementations of embodiments of the present disclosure.

Although the below examples describe instruction handling and distribution in the context of execution units and logic circuits, other embodiments of the present disclosure may be accomplished by way of data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions may be used to cause a general-purpose or special-purpose processor that is programmed with the instructions to perform the steps of the present disclosure. Embodiments of the present disclosure may be provided as a computer program product or software which may include a machine or computer-readable medium having stored thereon instructions which may be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as may be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions may be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein may be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "defining," "receiving," "determining," "issuing," "linking," "associating," "obtaining," "authenticating," "prohibiting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

What is claimed is:

1. An integrated circuit comprising:
 a data encoding circuit to prepare data for error correction, the data encoding circuit further to:
  receive a plurality of first data bits;
  receive a plurality of second data bits; and
  generate an error correcting code (ECC) from a combination of the plurality of first data bits and a plurality of third data bits derived from a conversion of the plurality of second data bits,
 processing logic to form a code word from a combination of the ECC and the plurality of first data bits;
 wherein a first combination of the plurality of second data bits enables correction of single bit errors and detection of double bit errors in the code word, and
 wherein a plurality of other combinations of the plurality of second data bits enables detection of single bit errors in the code word.

2. The integrated circuit of claim 1, wherein the plurality of second data bits comprises additional bits to be encoded within the ECC for later decoding, and wherein the processing logic further to transmit the plurality of first data bits with the code word.

3. The integrated circuit of claim 1, wherein the data encoding circuit further comprises an encoder to convert the plurality of second data bits to the plurality of third data bits.

4. The integrated circuit of claim 1, wherein the data encoding circuit further comprises an error correcting code (ECC) generator to:
 generate the ECC; and
 transmit the ECC to be combined with the plurality of first data bits.

5. The integrated circuit of claim 1, wherein the first combination comprises the plurality of second data bits being all zero ("0"), and wherein the plurality of other combinations comprises at least one bit of the plurality of second bits being a one ("1").

6. An integrated circuit comprising a data decoding circuit to detect and correct errors in data following reception of transmitted data, wherein the data decoding circuit to:
 receive a first code word, wherein the first code word is derived from: a plurality of first data bits, a plurality of second data bits, and an error correcting code algorithm;
 generate a second code word from the first code word by appending, to the first code word, assumed values of a plurality of third data bits, wherein the plurality of third data bits were derived from a conversion of the plurality of second data bits during data encoding;
 correct single bit errors and detect double bit errors in a first code word portion of the second code word for a first combination of the plurality of third data bits and the plurality of first data bits;
 detect single bit errors in the first code word portion of the second code word for a plurality of other combinations of the plurality of third data bits and the plurality of first data bits; and
 derive from the second code word, as corrected, the plurality of first data bits and the plurality of second data bits.

7. The integrated circuit of claim 6, wherein the data decoding circuit further to derive from the second code word, as corrected, indications of correctable errors and uncorrectable errors within the second code word.

8. The integrated circuit of claim 6, wherein the first combination comprises the plurality of third data bits being all zero ("0"), and wherein the plurality of other combinations comprises one bit of the plurality of third data bits being a one ("1").

9. The integrated circuit of claim 6, wherein the first code word comprises a received version of the plurality of first data bits and an error correcting code (ECC) generated from a combination of the plurality of first data bits and the plurality of third data bits, wherein the assumed values are values for the plurality of third data bits within the first combination, and wherein the data decoding circuit further to:
 execute error detection and correction, using the ECC, on the second code word; and
 output the second code word, as corrected.

10. The integrated circuit of claim 9, wherein, to execute the error detection and correction, the data decoding circuit further to:
 correct any single bit errors and detect any double bit errors in the first code word portion when values of the plurality of third data bits correspond to those of the first combination; and
 detect single bit errors in the first code word portion when the values of the plurality of third data bits correspond to those of one of the plurality of other combinations.

11. The integrated circuit of claim 9, wherein the data decoding circuit further comprises a decoder to:
 decode the plurality of second data bits from the plurality of third data bits, as corrected, wherein the plurality of second data bits are additional bits to be transmitted to a data requesting component with the plurality of first data bits; and
 output the plurality of second data bits with the plurality of first data bits in response to a data request.

12. A system on a chip (SoC) comprising:
 a data encoding circuit to prepare data for error correction when being stored in memory, the data encoding circuit to:
  receive a plurality of first data bits and a plurality of second data bits;
  derive a plurality of third data bits from the plurality of second data bits;
  generate an error correcting code (ECC) from the combination of the plurality of first data bits and the plurality of third data bits; and
  output, to store in the memory, a first code word comprising the ECC and the plurality of first data bits;

a data decoding circuit to perform error correction on the data read from the memory, the data decoding circuit to:
retrieve, from the memory, the first code word;
generate a second code word from the first code word by appending, to the first code word, assumed values of the plurality of third data bits;
using the ECC, correct single bit errors and detect double bit errors in a first code word portion of the second code word for a first combination of the plurality of third data bits and the plurality of first data bits;
detect, using the ECC, single bit errors in the first code word portion of the second code word for a plurality of other combinations of the plurality of third data bits and the plurality of first data bits; and
derive from the second code word, as corrected, the plurality of first data bits and the plurality of second data bits.

13. The SoC of claim 12, wherein the assumed values correspond to values of the plurality of third data bits within the first combination.

14. The SoC of claim 12, wherein the data decoding circuit further to derive from the second code word, as corrected, indications of correctable errors and uncorrectable errors within the code word.

15. The SoC of claim 12, wherein the data encoding circuit further comprises an encoder to convert the plurality of second data bits to the plurality of third data bits, and the plurality of second data bits comprise additional bits to also be provided in response to a read request for the plurality of first data bits.

16. The SoC of claim 15, wherein the plurality of first data bits and the plurality of second data bits comprise tag bits for memory address metadata.

17. The SoC of claim 15, wherein the data decoding circuit further comprises a decoder to:
decode the plurality of second data bits from the plurality of third data bits; and
output the plurality of second data bits with the plurality of first data bits in response to the read request.

18. The SoC of claim 17, wherein a zero output value of the plurality of second data bits is recreated as a NOR of the plurality of third data bits in the encoder.

19. The SoC of claim 12, wherein the first combination comprises the plurality of third data bits being all zero ("0"), and wherein the plurality of other combinations comprises one bit of the plurality of third data bits being a one ("1").

20. A method comprising:
receiving, by a data encoding circuit that prepares data for error correction before transmission, a plurality of first data bits and a plurality of second data bits;
converting the plurality of second data bits to a plurality of third data bits;
generating, by the data encoding circuit, an error correcting code (ECC) from a combination of the plurality of first data bits and the plurality of third data bits; and
transmitting, by processing logic, a first code word comprising the ECC and the plurality of first data bits in response to a data request;
wherein a first combination of the plurality of third data bits and the plurality of first data bits enables, through use of the ECC, correction of single bit errors and detection of double bit errors in the code word, and
wherein a plurality of other combinations of the plurality of third data bits and the plurality of first data bits enables, through use of the ECC, detection of single bit errors in the code word.

21. The method of claim 20, wherein the data bits comprise cache metadata related to storage in cache memory, the method further comprising transmitting the code word to a data requesting component.

22. The method of claim 20, further comprising:
receiving, by a data decoding circuit in response to the data request, the code word, wherein the code word is a first code word;
generating a second code word from the first code word by appending, to the first code word, assumed values of the plurality of third data bits;
correcting, by the data decoding circuit using the ECC, single bit errors in a first code portion of the second code word and detecting, by the data decoding circuit using the ECC, double bit errors in the first code portion of the second code word for the first combination;
detecting, by the data decoding circuit using the ECC, single bit errors in the first code portion of the second code word for the plurality of other combinations; and
deriving, from the second code word as corrected by the data decoding circuit, the plurality of first data bits and the plurality of third data bits.

23. The method of claim 22, further comprising:
decoding, by the data decoding circuit, the plurality of second data bits from the plurality of third data bits, the plurality of second data bits comprising additional bits to be provided with the plurality of first data bits; and
outputting the plurality of second data bits with the plurality of first data bits in response to the data request.

24. The method of claim 20, wherein the first combination comprises the plurality of third data bits being all zero ("0"), and wherein the plurality of other combinations comprises one bit of the plurality of third data bits being a one ("1").

* * * * *